(12) United States Patent
Hashimoto

(10) Patent No.: US 11,316,080 B2
(45) Date of Patent: Apr. 26, 2022

(54) LIGHT EMITTING DEVICE AND METHOD OF MANUFACTURING LIGHT EMITTING DEVICE

(71) Applicant: NICHIA CORPORATION, Anan (JP)

(72) Inventor: Toru Hashimoto, Tokushima (JP)

(73) Assignee: Nichia Corporation, Anan (JP)

( * ) Notice: Subject to any disclaimer, the term of this patent is extended or adjusted under 35 U.S.C. 154(b) by 0 days.

(21) Appl. No.: 16/938,493

(22) Filed: Jul. 24, 2020

(65) Prior Publication Data
US 2020/0357960 A1 Nov. 12, 2020

Related U.S. Application Data

(62) Division of application No. 16/358,300, filed on Mar. 19, 2019, now Pat. No. 10,763,403.

(30) Foreign Application Priority Data

Mar. 20, 2018 (JP) .............................. JP2018-052150

(51) Int. Cl.
*H01L 33/50* (2010.01)
*H01L 33/58* (2010.01)
*H01L 33/60* (2010.01)

(52) U.S. Cl.
CPC ............ *H01L 33/505* (2013.01); *H01L 33/58* (2013.01); *H01L 33/60* (2013.01); *H01L 2933/0041* (2013.01); *H01L 2933/0058* (2013.01)

(58) Field of Classification Search
CPC ....... H01L 33/505; H01L 33/58; H01L 33/60; H01L 2933/0041; H01L 2933/0058;
(Continued)

(56) References Cited

U.S. PATENT DOCUMENTS

2002/0079837 A1\* 6/2002 Okazaki .................. H01L 33/54
313/512
2004/0065894 A1 4/2004 Hashimoto et al.
(Continued)

FOREIGN PATENT DOCUMENTS

| JP | 7-86640 A | 3/1995 |
| JP | 2003-152225 A | 5/2003 |

(Continued)

*Primary Examiner* — Shahed Ahmed
(74) *Attorney, Agent, or Firm* — Birch, Stewart, Kolasch & Birch, LLP

(57) ABSTRACT

A light emitting device includes a light emitting element, a light guide member, a reflecting member, a wavelength conversion member. The light emitting element has a light emitting surface and lateral surfaces. The light guiding member is provided on at least a portion of the lateral surfaces of the light emitting element. The reflecting member is provided on the lateral surface of the light emitting element with the light guiding member interposed therebetween. The wavelength conversion member is provided on the light emitting surface of the light emitting element, the light guiding member and the reflecting member. The wavelength conversion member is provided with a recess between an outer lateral surface of the wavelength conversion member and the light guiding member. The reflecting member is provided in the recess.

9 Claims, 18 Drawing Sheets

(58) Field of Classification Search
CPC .................. H01L 33/50; H01L 33/486; H01L 33/00–648; H01L 27/15–156; H01L 2933/00–0091; H01L 51/50–56
See application file for complete search history.

(56) References Cited

U.S. PATENT DOCUMENTS

| | | |
|---|---|---|
| 2006/0022215 A1 | 2/2006 | Arndt et al. |
| 2011/0121731 A1 | 5/2011 | Tsutsumi et al. |
| 2011/0204407 A1 | 8/2011 | Cupta et al. |
| 2011/0213077 A1 | 9/2011 | Bertucci et al. |
| 2013/0285091 A1 | 10/2013 | Akimoto et al. |
| 2015/0001563 A1 | 1/2015 | Miki |
| 2016/0072013 A1 | 3/2016 | Sugizaki |
| 2016/0155914 A1 | 6/2016 | Miki |
| 2016/0190401 A1 | 6/2016 | Mazuir et al. |
| 2016/0268480 A1 | 9/2016 | Yamamoto |
| 2016/0293810 A1* | 10/2016 | Baike ...................... H01L 33/32 |
| 2016/0348876 A1* | 12/2016 | Azuma .............. B29D 11/0074 |
| 2016/0351765 A1 | 12/2016 | Suzuki |
| 2016/0351766 A1* | 12/2016 | Hayashi ................. H01L 33/56 |
| 2017/0005238 A1 | 1/2017 | Hung et al. |
| 2017/0054061 A1* | 2/2017 | Naka ...................... H01L 33/56 |
| 2017/0062681 A1 | 3/2017 | Miyoshi et al. |
| 2017/0092817 A1 | 3/2017 | Ikeda et al. |
| 2017/0092825 A1 | 3/2017 | Bando |
| 2017/0133562 A1 | 5/2017 | Ling et al. |
| 2017/0179344 A1* | 6/2017 | Matsuda ............. H01L 33/0095 |
| 2017/0256674 A1 | 9/2017 | Hashimoto |
| 2018/0053882 A1 | 2/2018 | Cheng et al. |
| 2018/0182938 A1 | 6/2018 | Miki |
| 2018/0190886 A1 | 7/2018 | Suzuki |
| 2018/0233638 A1 | 8/2018 | Miyoshi et al. |
| 2019/0189868 A1 | 6/2019 | Baike et al. |

FOREIGN PATENT DOCUMENTS

| | | |
|---|---|---|
| JP | 2006-516816 A | 7/2006 |
| JP | 2010-186952 A | 8/2010 |
| JP | 2011-108589 A | 6/2011 |
| JP | 2012-507170 A | 3/2012 |
| JP | 2012-84930 A | 4/2012 |
| JP | 2012-204438 A | 10/2012 |
| JP | 2013-12545 A | 1/2013 |
| JP | 2013-77679 A | 4/2013 |
| JP | 2013-232539 A | 11/2013 |
| JP | 2013-251417 A | 12/2013 |
| JP | 2014-197690 A | 10/2014 |
| JP | 2015-12081 A | 1/2015 |
| JP | 2016-58551 A | 4/2016 |
| JP | 2016-530725 A | 9/2016 |
| JP | 2016-197715 A | 11/2016 |
| JP | 2016-219743 A | 12/2016 |
| JP | 2017-50359 A | 3/2017 |
| JP | 2017-69368 A | 4/2017 |
| JP | 2017-92449 A | 5/2017 |
| JP | 2017-212470 A | 11/2017 |
| JP | 2018-22758 A | 2/2018 |
| JP | 2018-29179 A | 2/2018 |

* cited by examiner

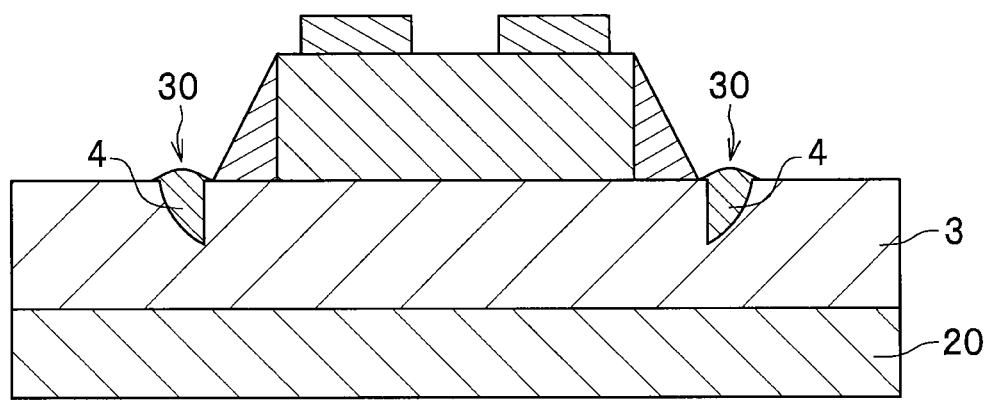
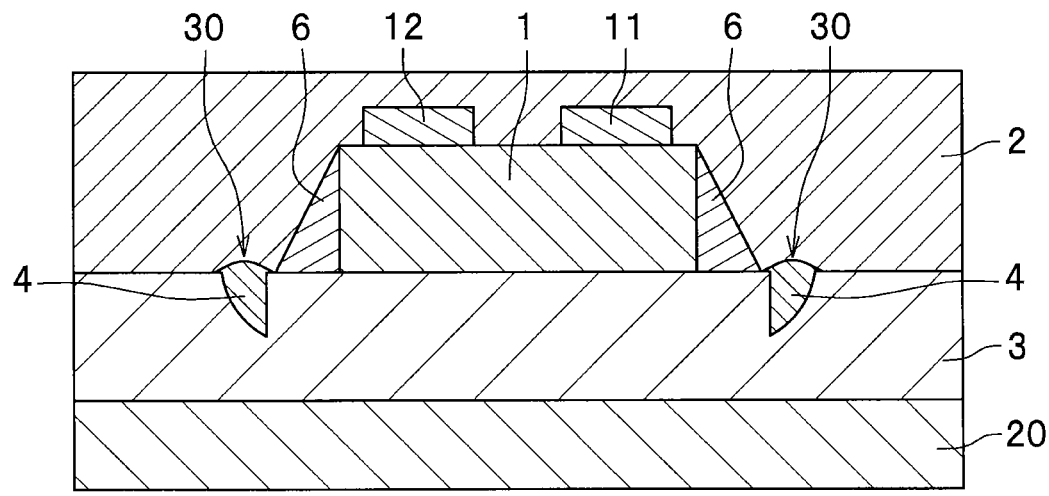

LIGHT EMITTING DEVICE AND METHOD OF MANUFACTURING LIGHT EMITTING DEVICE

CROSS-REFERENCE TO RELATED APPLICATION

This application is a Divisional of copending application Ser. No. 16/358,300, filed on Mar. 19, 2019, which claims priority under 35 U.S.C. § 119(a) to Application No. 2018-052150, filed in Japan on Mar. 20, 2018, all of which are hereby expressly incorporated by reference into the present application.

BACKGROUND

The present disclosure relates to a light emitting device and method of manufacturing a light emitting device.

For example, Japanese Patent Publication No. 2013-12545 discloses a light emitting device in which a fluorescent plate is bonded onto a light emitting element, and the periphery of the fluorescent plate is covered with a light-reflective white member. The upper surface of the light emitting device has two colors: the color of a fluorescent material contained in the fluorescent plate (e.g. yellow) and the color of the white member (white).

In addition, some light emitting devices have a configuration in which no light reflecting member is provided on a lateral surface of a wavelength conversion member such as a fluorescent layer (see, for example, Japanese Patent Publication No. 2013-77679).

When the light emitting device disclosed in the Publication No. 2013-12545 is used as, for example, a light source of a lighting device such as a flashlight for a camera of a smartphone, the color of the fluorescent material and the color of the white member appear on a lens during a non-light-emission period. Thus, for example, depending on the design of a smartphone or a cover thereof, the upper surface of the light emitting device disclosed in the Publication No. 2013-12545 has a part different color from the wavelength conversion member, and has an unfavorable appearance.

The light emitting device disclosed in the Publication No. 2013-77679 has the color of the wavelength conversion member over the entire upper surface of the light emitting device, but the light emitting device has a wide light emitting region during a light-emission period, and small contrast of lightness and darkness.

SUMMARY

Certain embodiment according to the present disclosure is intended to provide a light emitting device having the color of a wavelength conversion member over the entire upper surface of the light emitting device during a non-light-emission period, and has large contrast of lightness and darkness in a light emitting region on the upper surface thereof during a light-emission period, and a method of manufacturing the light emitting device.

A light emitting device according to certain embodiment of the present disclosure includes a light emitting element, a light guide member, a reflecting member, a wavelength conversion member. The light emitting element has a light emitting surface and lateral surfaces. The light guiding member is provided on at least a portion of the lateral surfaces of the light emitting element. The reflecting member is provided on the lateral surface of the light emitting element with the light guiding member interposed therebetween. The wavelength conversion member is provided on the light emitting surface of the light emitting element, the light guiding member and the reflecting member. The wavelength conversion member is provided with a recess between an outer lateral surface of the wavelength conversion member and the light guiding member. The reflecting member is provided in the recess.

A method of manufacturing a light emitting device according to certain embodiment of the present disclosure includes: disposing a light emitting element on a wavelength conversion member such that a light emitting surface of the light emitting element faces a first surface of the wavelength conversion member opposite to a second surface of the wavelength conversion member, while providing a light guiding member so as to cover at least a portion of lateral surfaces of a light emitting element; forming a recess at a periphery of the light guiding member by removing a part of the wavelength conversion member at a periphery of the light guiding member; and disposing a reflecting member in the recess and to cover the light emitting element and the light guiding member.

A method of manufacturing a light emitting device according to certain embodiment of the present disclosure includes: disposing a light emitting element on a wavelength conversion member such that a light emitting surface of the light emitting element faces a first surface of the wavelength conversion member opposite to a second surface of the wavelength conversion member, while providing a light guiding member so as to cover at least a portion of lateral surfaces of a light emitting element; covering the light emitting element and the light guiding member with a first reflecting member; forming a recess passing through the first reflecting member at a periphery of the light guiding member by piercing the first reflecting member at the periphery of the light guiding member, and removing a part of the wavelength conversion member; and supplying a second reflecting member in the recess.

The light emitting device of the embodiment according to the present disclosure can have the color of the wavelength conversion member over the entire upper surface of the light emitting device during a non-light-emission period, and have large contrast of lightness and darkness in a light emitting region during a light-emission period.

The method of manufacturing the light emitting device of the embodiment according to the present disclosure can achieve the light emitting device having the color of the wavelength conversion member over the entire upper surface of the light emitting device during a non-light-emission period, and having large contrast of lightness and darkness in a light emitting region during a light-emission period.

BRIEF DESCRIPTION OF THE DRAWINGS

FIG. 8A is a sectional diagram showing a step of supplying a second reflecting member in the recess of the wavelength conversion member in the method of manufacturing a light emitting device according to the second embodiment.

FIG. 8B is a sectional diagram showing a step of covering the light emitting element and the like with a first reflecting member in the method of manufacturing a light emitting device according to the second embodiment.

DETAILED DESCRIPTION OF EMBODIMENTS

Embodiments

Figure 1A:
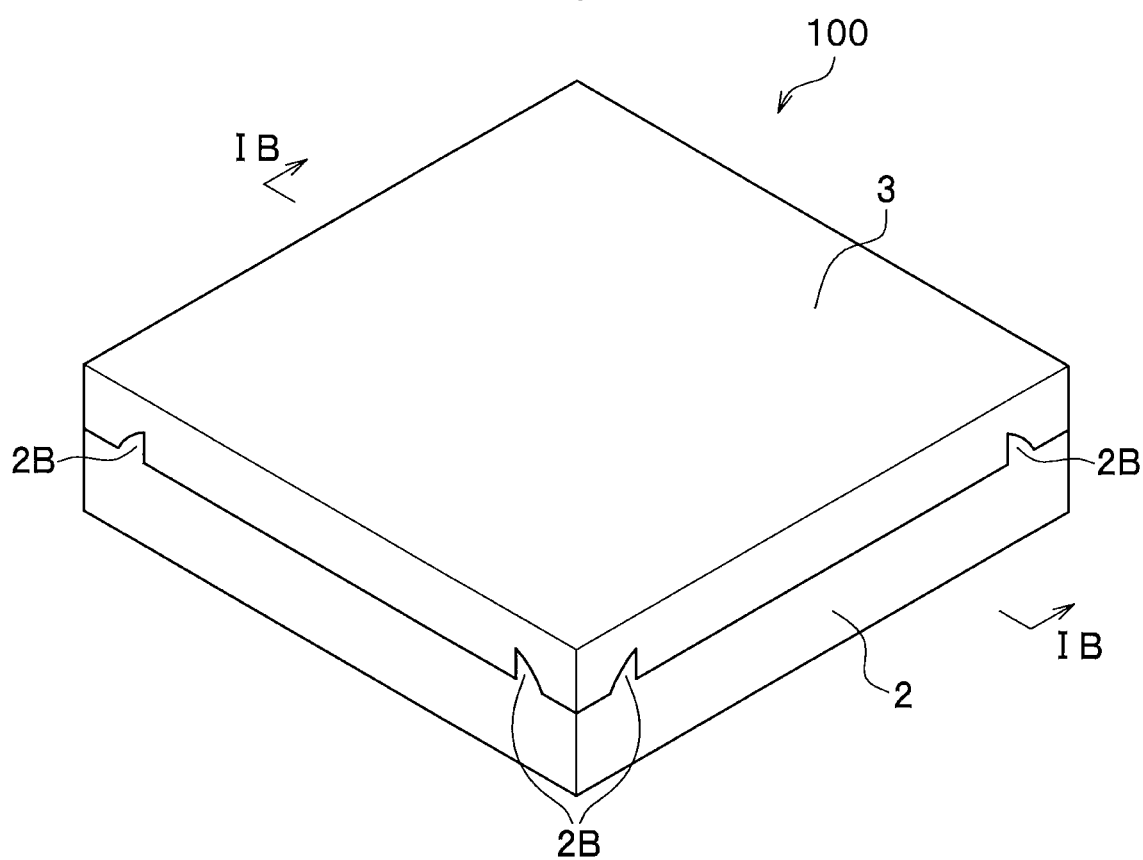
FIG. 1A is a perspective view schematically showing a configuration of a light emitting device according to a first embodiment.

Embodiments will be described below with reference to the drawings. The embodiments shown below are intended to illustrate a light emitting device and a method of manufacturing a light emitting device for embodying the technical concepts of the embodiments, but are not intended to limit the scope of the invention to those described. The dimensions, materials, shapes, relative arrangements and the like of components described in the embodiments are not intended to limit the scope of the present invention thereto, and are merely illustrative unless otherwise specified. The sizes, positional relations and the like of members shown in the drawings may be exaggerated for clarification of explanation.

First Embodiment

Light Emitting Device

First, a light emitting device according to a first embodiment will be described.

Figure 1B:
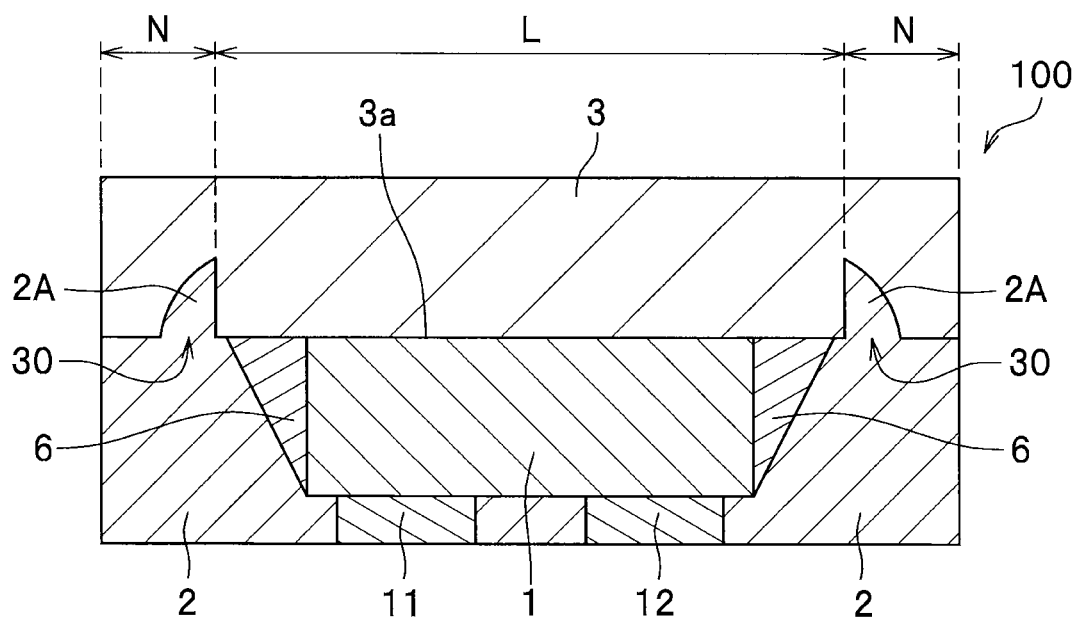
FIG. 1B is a sectional view taken along line IB-IB in FIG. 1A.
Figure 1C:
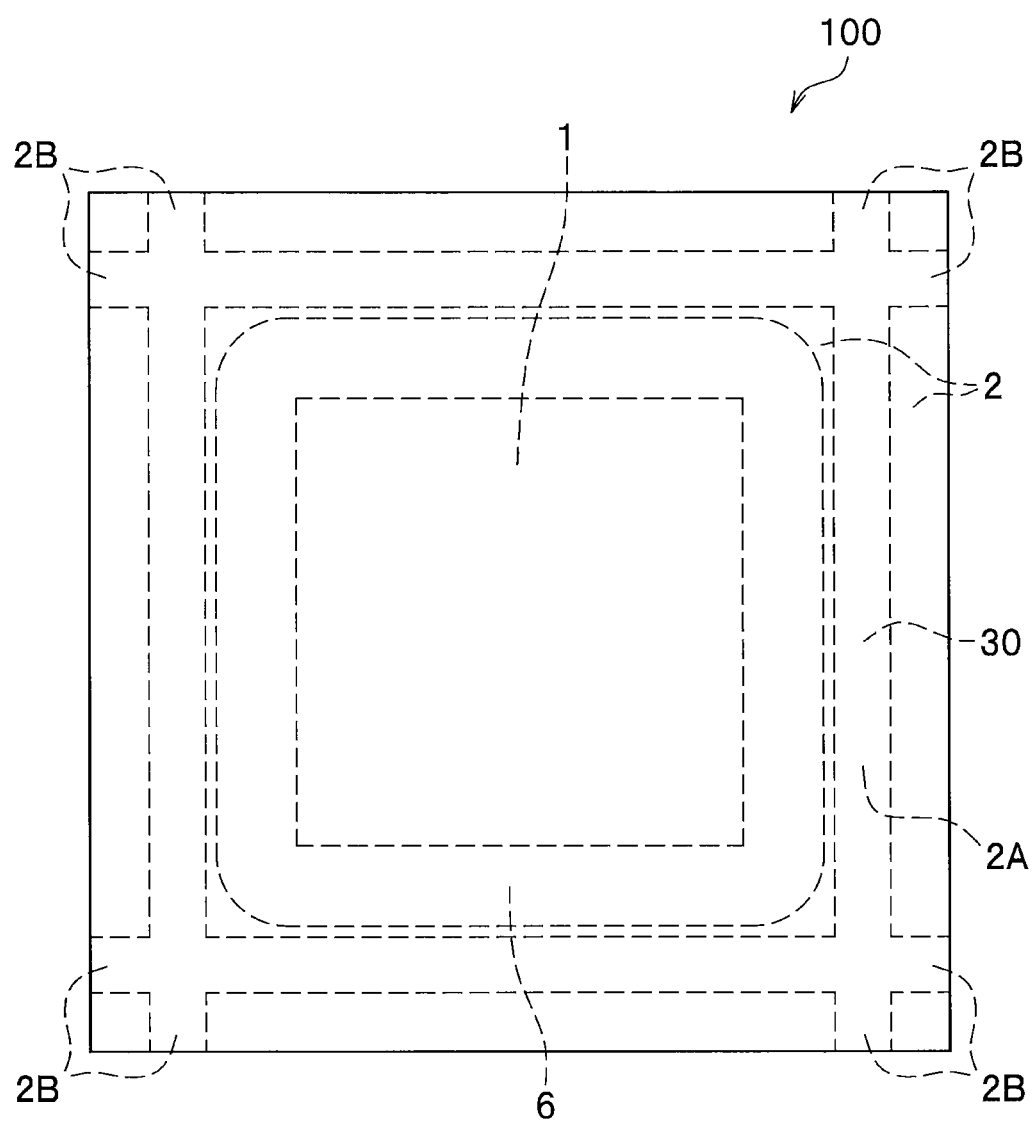
FIG. 1C is a plan view schematically showing the configuration of the light emitting according to the first embodiment.

As shown in FIGS. 1A to 1C, a light emitting device 100 includes a light emitting element 1, a reflecting member 2, a wavelength conversion member 3 and a light guiding member 6.

The upper surface of the light emitting device 100 includes an intensely light-emitting region and a slightly light-emitting region. The intensely light-emitting region is a region which intensely emits light during a light-emission period on the upper surface of the light emitting device 100, in other words, inner/center side of the upper surface of the light emitting device 100. The slightly light-emitting region is a region other than the intensely light-emitting region on the upper surface of the light emitting device 100, in other words, outside/outer edge side of the upper surface of the light emitting device 100. In the present disclosure, with respect to an extended line from a lateral surface of a recess 30 on the light guiding member 6 side, a region inside than the extended line on the upper surface of the light emitting device 100 is an intensely light-emitting region L, and a region on the extended line and outside the extended line is a slightly light-emitting region N. However, the intensely light-emitting region and the slightly light-emitting region are not strictly determined, and may be appropriately determined according to the structure of the light emitting device 100, the shape of the recess 30 and the light emitting state.

Light Emitting Element

As the light emitting element 1, a semiconductor light emitting element such as a LED element can be used. The light emitting element 1 may have a structure in which a pair of positive and negative electrodes 11 and 12 are formed on an element composed of various semiconductors. In particular, the light emitting element 1 is preferably formed using a nitride semiconductor ($In_xAl_yGa_{1-x-y}N$, $0 \leq x$, $0 \leq y$, $x+y \leq 1$) which can efficiently excite a fluorescent material. In addition, the light emitting element 1 may be formed using a zinc sulfide-based semiconductor, a zinc selenide-based semiconductor or a silicon carbide-based semiconductor.

Reflecting Member

The reflecting member 2 reflects light from the light emitting element 1 to extract the light through the wavelength conversion member 3. The reflecting member 2 reflects light, which is emitted by the light emitting element 1 and travels laterally or downward, toward the wavelength conversion member 3 serving as a light emitting region on the upper surface of the light emitting device 100.

The reflecting member 2 is provided on at least one lateral surface of the light emitting element 1 and below the wavelength conversion member 3. The reflecting member 2 is provided on the light guiding member 6 formed on at least one of the lateral surfaces of the light emitting element 1. Specifically, the reflecting member 2 covers the lower surface of the light emitting element 1, in other words, the surface on which the electrodes 11 and 12 are formed. Further, the reflecting member 2 covers the lateral surfaces of the light emitting element 1 such that the reflecting member 2 surrounds the lateral surfaces with the light guiding member 6 interposed therebetween for regions covered with the light guiding member 6, and directly covers the lateral surfaces of the light emitting element for regions which are not covered with the light guiding member 6.

In addition, the reflecting member 2 protrudes in a frame shape to the wavelength conversion member 3 side from an interface with the wavelength conversion member 3 to form a frame-shaped protruding portion 2A in the recess 30. The light emitting device 100 has the frame-shaped protruding portion 2A, so that the intensely light-emitting region and the slightly light-emitting region can be easily distinguished, leading to an increase in contrast between the intensely light-emitting region and the slightly light-emitting region during a light-emission period. This can increase contrast of lightness and darkness in the light emitting region during a light-emission period. In the light emitting device 100, the reflecting member 2 provided on the lateral surfaces of the light emitting element 1 and below the wavelength conversion member 3 and the reflecting member 2 forming the frame-shaped protruding portion 2A provided in the recess 30 of the wavelength conversion member 3 are integrally formed as one member.

As shown in FIG. 1B, the frame-shaped protruding portion 2A is formed in a shape protruding in the wavelength conversion member 3 in sectional view. Lateral surfaces of the frame-shaped protruding portion 2A on the outside surface side of the wavelength conversion member 3 are covered with the wavelength conversion member 3 in sectional view. As shown in FIG. 1C, the frame-shaped protruding portion 2A is formed in a quadrangular annular shape surrounding the outer lateral surfaces of the outer edge of the light guiding member 6 in plan view. In the present disclosure, the frame-shaped protruding portion 2A has extending portions 2B which extend from the four corners of the frame-shaped protruding portion 2A and formed on at least one outside surface of the light emitting device 100. The extending portion 2B is generated, for example when a plurality of light emitting elements 1 is disposed on a large sheet provided with the wavelength conversion member 3, and the recess 30 is continuously formed in each of the column direction and the row direction of the sheet in the method of manufacturing the light emitting device 100.

Lateral surfaces of the frame-shaped protruding portion 2A on the light guiding member 6 side are formed substantially perpendicular to the light emitting surface of the light emitting element 1 in sectional view. The frame-shaped protruding portion 2A has a shape in which lateral surfaces on the outside surface side of the wavelength conversion member 3 are inclined in sectional view. For example, the lateral surfaces of the outside surface side of the wavelength conversion member 3 each have an arc shape as shown in FIG. 1B. That is, the frame-shaped protruding portion 2A has a sectional-view shape in which the tip is thinned, and lateral surfaces on one side are linear while the other lateral surfaces on the other side are curved.

The lateral surfaces of the frame-shaped protruding portion 2A on the light guiding member 6 side are formed substantially perpendicular to the light emitting surface of the light emitting element 1 in sectional view, thus contrast between the intensely light-emitting region and the slightly light-emitting region during a light-emission period can be increased. This can increase contrast of lightness and darkness in the light emitting region during a light-emission period.

Because the lateral surfaces of the frame-shaped protruding portion 2A positioned on the outside surface side of the wavelength conversion member 3 are inclined in sectional view, the frame-shaped protruding portion 2A is tapered toward the upper surface of the light emitting device 100 while the width of the frame-shaped protruding portion 2A is maintained. Accordingly, the width of the frame-shaped protruding portion 2A decreases as approaching toward the upper surface of the light emitting device 100, so that the frame-shaped protruding portion 2A is less likely to be seen when viewed from the upper surface of the light emitting device 100. Thus, the color of the wavelength conversion member 3 on the upper surface of the light emitting device 100 is less likely to be affected by the color of the frame-shaped protruding portion 2A while the width of the frame-shaped protruding portion 2A is maintained.

Therefore, due to the inclined lateral surfaces of the frame-shaped protruding portion 2A on the side of the outside surface of the wavelength conversion member 3, the color of the entire upper surface of the light emitting device 100 during a non-light-emission period can be substantially the same as the color of the wavelength conversion member 3 more easily while contrast between the intensely light-emitting region and the slightly light-emitting region during a light-emission period is increased.

The reflecting member 2 is, for example, a resin layer containing a reflecting substance. The reflecting member 2 may contains a filler in addition to a reflecting substance in a resin as a base material or binder.

The binder is a resin for binding the reflecting member 2 such as the reflecting substance and filler to the lateral surfaces and the lower surface (i.e., the surface on which the electrodes 11 and 12 are formed) of the light emitting element 1. Examples of the resin as a binder include polycarbonate resins, epoxy resins, phenol resins, silicone resins, acrylic resins, TPX resins, polynorbornene resins and urethane resins. Alternatively, examples of the resin as a binder include modified resins of the above-mentioned resins, and hybrid resins including one or more of the above-mentioned resins. In particular, silicone resins or modified silicone resins are preferable because they are highly resistant to heat and weather, and undergo small volumetric shrinkage after curing.

The reflecting substance reflects light emitted by the light emitting element 1. Examples of the reflecting substance include silica, titanium oxide, silicon oxide, aluminum oxide, potassium titanate, zinc oxide and boron nitrate. In addition, resin powder such as silicone powder may be used.

The filler is added for increasing the mechanical strength of the reflecting member 2 as a resin layer, or increasing the thermal conductivity of the reflecting member 2. Examples of the filler include glass fibers, whiskers, aluminum oxide, silicon oxide, boron nitride, zinc oxide and aluminum nitride.

Light Guiding Member

The light guiding member 6 facilitates extraction of light from the light emitting element 1, and guides light from the light emitting element 1 to the wavelength conversion member 3. The light guiding member 6 can improve luminous flux and light extraction efficiency.

The light guiding member 6 is formed by a bonding member for bonding the wavelength conversion member 3 and the light emitting element 1 to each other that creeps up to lateral surfaces of the light emitting element 1. The light guiding member 6 is formed upside down during manufacturing.

As the light guiding member 6, for example, a light-transmissive resin material can be used. In addition, examples of the light guiding member 6 include light-transmissive adhesive materials such as the resins to be used as the base material or binder of the reflecting member 2. In addition, the light guiding member 6 may contain a diffusing agent such as silica, titanium oxide, silicon oxide, aluminum oxide, potassium titanate, zinc oxide or boron nitride. This can allow light to enter the wavelength conversion member 3 uniformly, to thereby alleviate color non-uniformity of the light emitting device 100.

As shown in FIG. 1B, the light guiding member 6 is formed in a triangular shape such that the width of the member increases as approaching toward the wavelength conversion member 3 from the lower surface (i.e., the surface on which electrodes 11 and 12 are formed) of the light emitting element 1 in sectional view. This form can improve luminous flux and light extraction efficiency. However, the shape of the light guiding member 6 is not particularly specified. For example, the guiding member 6 may have a curved surface projecting toward the reflecting member 2 side, or a curved surface depressing toward the light emitting element 1 side.

The light guiding member 6 is required to cover a part of the lateral surface of the light emitting element 1, and preferably covers substantially the entire lateral surfaces of the light emitting element 1 from the viewpoint of improving luminous flux and light extraction efficiency.

In addition, the light guiding member 6 may be positioned between the wavelength conversion member 3 and the light emitting element 1.

Wavelength Conversion Member

The wavelength conversion member 3 contains a wavelength conversion substance which absorbs a part of light having a wavelength of light emitted by the light emitting element 1, converts the absorbed light to light having a different wavelength, and emits the converted light. The wavelength conversion substance 3 is, for example, a fluorescent material. Hereinafter, the following description is given on the premise that the wavelength conversion substance is a fluorescent substance.

The wavelength conversion member 3 is positioned on the light emitting surface of the light emitting element 1, the light guiding member 6 and the reflecting member 2.

The lower surface of the wavelength conversion member 3, in other words, a surface facing the light emitting surface of the light emitting element 1 has a larger size than the light emitting surface that is the upper surface of the light emitting element 1.

The wavelength conversion member 3 is provided with the recess 30 between the outside surface of the wavelength conversion member 3 and the light guiding member 6. Specifically, the recess 30 has a quadrangular annular portion of the recess 30 that surrounds the outer lateral surfaces of the outer edge of the light guiding member 6 positioned on the light emitting element 1 side from the outer lateral surfaces of the wavelength conversion member 3. The wavelength conversion member 3 is present outward of the quadrangular annular portion of the recess 30. The recess 30 is provided in such a manner that the quadrangular annular portion does not reach the outside surface of the light emitting device 100, and is not wholly or partially provided on the light guiding member 6.

The recess 30 is formed in a quadrangular annular portion surrounding the outer lateral surfaces of the outer edge of the light guiding member 6 as in the case of the frame-shaped protruding portion 2A. In addition, the recess 30 corresponds to the extending portion 2B of the frame-shaped protruding portion 2A, and in the present disclosure, extends from the four corners of the quadrangular annular portion to the outside surface of the light emitting device 100.

The reflecting member 2 is provided in the recess 30 to form the frame-shaped protruding portion 2A.

The recess 30 is formed of such a shape that the tip is pointed, and one lateral surface is linear while the other lateral surface is curved as in the case of the frame-shaped protruding portion 2A.

The thickness of the wavelength conversion member 3 in the up-down direction except the recess 30 can be determined by the content of a fluorescent material, the color after color mixing of light emitted by the light emitting element 1 and light after wavelength conversion, or the like, and may be, for example, 50 µm or more and 300 µm or less.

The depth of the recess 30 is preferably 20% or more and 80% or less of the thickness of the wavelength conversion member 3. The recess 30 having the depth of 20% or more with respect to the thickness of the wavelength conversion member 3 can increase contrast between the intensely light-emitting region and slightly light-emitting region. The recess 30 having the depth of 80% or less with respect to the thickness of the wavelength conversion member 3 can make the reflecting member 2 in the recess 30 appear when viewed from the upper surface of the light emitting device 100. Accordingly, the color of the entire upper surface of the light emitting device 100 during a non-light-emission period can easily be substantially the same as the color of the wavelength conversion member 3. The depth of the recess 30 is more preferably 40% or more with respect to the thickness of the wavelength conversion member 3 from the viewpoint of increasing contrast between the intensely light-emitting region and the slightly light-emitting region during a light-emission period. In addition, the depth of the recess 30 is more preferably 60% or less with respect to the thickness of the wavelength conversion member 3 from the viewpoint of ensuring that the color of the entire upper surface of the light emitting device 100 is easily made substantially the same as the color of the wavelength conversion member 3 during a non-light-emission period.

The depth of the recess 30 in the present disclosure is the maximum depth from a first surface 3a of the wavelength conversion member 3.

The phrase "the entire upper surface of the light emitting device 100 has the color of the wavelength conversion member 3 during a non-light-emission period" means that the color of the entire upper surface of the light emitting device 100 is either the same or substantially the same color of the color of the wavelength conversion member 3. The term "substantially the same" means that for example in the constant hue plane of the Munsell color system (20 hues), the colors may be in a range of two neighboring levels in each of the hue, the value and the chroma.

The width of the wavelength conversion member 3, in other words, the sum of N+L+N in FIG. 1B may be 200 μm or more and 2.4 mm or less. More preferably, the width of the wavelength conversion member 3 is 200 μm or more and 240 μm or less.

The width of the recess 30 is preferably 20 μm or more and 100 μm or less. The recess 30 having the width of 20 μm or more can increase contrast between the intensely light-emitting region and the slightly light-emitting region during a light-emission period. On the other hand, the recess 30 having the width of 100 μm or less can allow the color of the entire upper surface of the light emitting device 100 to easily be substantially the same as the color of the wavelength conversion member 3 during a non-light-emission period. The width of the recess 30 is more preferably 40 μm or more from the viewpoint of increasing contrast between the intensely light-emitting region and the slightly light-emitting region during a light-emission period. In addition, the width of the recess 30 is more preferably 80 μm or less from the viewpoint of ensuring that the color of the entire upper surface of the light emitting device 100 is easily made substantially the same as the color of the wavelength conversion member 3 during a non-light-emission period.

In the present disclosure, the width of the recess 30 refers the width of the recess 30 at a region at half of the length between the opening and the deepest portion of the recess 30. The widths at regions between half the depth of the recess 30 and the tip of the recess 30 may be smaller than the above-mentioned width. In the present disclosure, the width of the recess 30 also refers the width of the frame-shaped protruding portion 2A provided in the recess 30. When the recess 30 is provided with a gap between the frame-shaped protruding portion 2A, the width of the frame-shaped protruding portion 2A is preferably in the above-mentioned range.

Preferably, the base material or binder of the wavelength conversion member 3 is formed of a light-transmissive resin. Example resins include the resins to be used as the base material or binder of the reflecting member 2. In particular, silicone resins or modified silicone resins are preferable because they are highly resistant to heat and weather, and undergo small volumetric shrinkage after curing. In addition, the base material or binder of the wavelength conversion member 3 may be formed of glass in place of a resin.

Examples of the fluorescent material contained in the wavelength conversion member 3 include yttrium aluminum garnet activated with cerium, lutetium aluminum garnet activated with cerium, terbium aluminum garnet activated with cerium, nitrogen-containing calcium aluminosilicate activated with one or both of europium and chromium, sialon activated with europium, silicate activated with europium, and potassium silicate fluoride activated with manganese.

The body color of the fluorescent material may have any color. The body color refers to the color of a member itself of the light emitting device 100 during a non-light-emission period.

For example, when using a fluorescent material having a white body color, the body color of the wavelength conversion member 3 is white. Thus, the entire upper surface of the light emitting device 100 is a white color during a non-light-emission period.

The body color can be measured using, for example, measuring devices such as CM series spectrophotometers (manufactured by Konica Minolta, Inc.) and CR series color difference meters (manufactured by Konica Minolta, Inc.). Among these measuring devices, a measuring device may be used which includes a xenon lamp as a light source and a silicon photodiode as a light emitting element, and is capable of splitting light in a plane diffraction grating, and performing outputting in the Munsell color system.

When the light emitting device 100 is used as, for example, a white light source of an lighting device such as a flashlight for a camera, the light emitting device 100 is preferably configured with a light emitting element which emits blue light and a fluorescent material which emits yellow color and has a yellow body color. In addition, the light emitting device 100 is configured with a light emitting element which emits blue light, and a fluorescent material which emits orange light and has an orange body color.

Examples of the fluorescent material which has a yellow body color and emits yellow light include yttrium aluminum garnet-based fluorescent materials (YAG-based fluorescent materials), lutetium aluminum garnet-based fluorescent materials (LAG-based fluorescent materials) and terbium aluminum garnet-based fluorescent materials (TAG-based fluorescent materials). In addition, examples of the fluorescent material which has a yellow body color and emit red light include KSF. The body colors of these fluorescent materials correspond to 10Y or 5Y in the Munsell hue circle of the Munsell color system (20 hues).

Examples of the fluorescent material which has an orange body color and emits red light include SCASN and CASN. The body colors of these fluorescent materials correspond to 10YR or 5YR in the Munsell hue circle of the Munsell color system (20 hues).

In addition, a fluorescent material which emit orange light can be obtained by mixing a fluorescent material which emits yellow light, and a fluorescent material which emits red light.

In addition, the colors of fluorescent materials whose body color is yellow or orange correspond to, for example, hues of 5YR, 10YR, 5Y and 10Y in the Munsell hue circle of the Munsell color system (20 hues).

A fluorescent material having yellow body color corresponds to, for example, 10Y or 5Y. A fluorescent material having orange body color corresponds to, for example, 10YR or 5YR. An explanation will be given below assuming a fluorescent material has a yellow body color and corresponds to 5Y in the Munsell hue circle of the Munsell color system (20 hues).

In the Munsell color system, for example, the value is 7 or more and 9 or less, and the chroma is 4 or more and 14 or less.

The wavelength conversion member 3 may contain a diffusing agent. The diffusing agent is added for efficiently diffusing light emitted by the light emitting element 1 and the fluorescent material. The diffusing agent is, for example, the same as the reflecting substance in the reflecting member 2.

Operation of Light Emitting Device

The operation of the light emitting device 100 will now be described.

When the light emitting device 100 is driven, power is supplied to the light emitting element 1 from an external power supply through electrodes 11 and 12, and the light emitting element 1 emits light. A part of light emitted by the light emitting element 1 is reflected at the reflecting member 2, and passes through the wavelength conversion member 3 to be extracted outside. The frame-shaped protruding portion 2A is provided in the recess 30 of the wavelength conversion member 3, to thereby increase contrast of lightness and darkness (i.e., luminance difference) on the upper surface of the light emitting device 100.

Method of Manufacturing Light Emitting Device

One example of a method of manufacturing the light emitting device 100 according to the first embodiment will now be described with reference to FIGS. 2 to 4C. FIGS. 3A to 4C schematically show one light emitting device 100 at the time of manufacturing a plurality of light emitting devices 100 at once.

Figure 2:
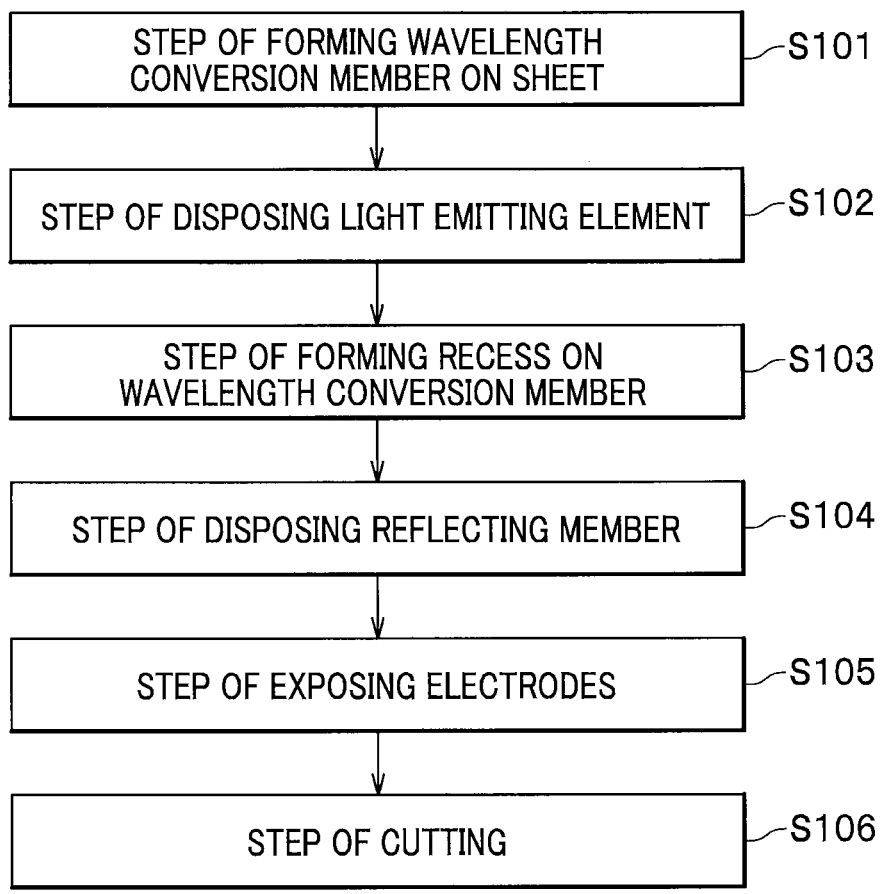
FIG. 2 is a flow chart of a method of manufacturing a light emitting device according to the first embodiment.

As shown in FIG. 2, the method of manufacturing the light emitting device 100 according to the first embodiment includes a step S101 of forming a wavelength conversion member on a sheet, a step S102 of disposing a light emitting element, a step S103 of forming a recess on the wavelength conversion member, a step S104 of disposing a reflecting member, a step S105 of exposing electrodes, and a step S106 of cutting.

The materials, arrangements and the like of the members are essentially the same as described above for the light emitting device 100, and therefore descriptions thereof are appropriately omitted here.

Step of Forming Wavelength Conversion Member on Sheet

Figure 3A:
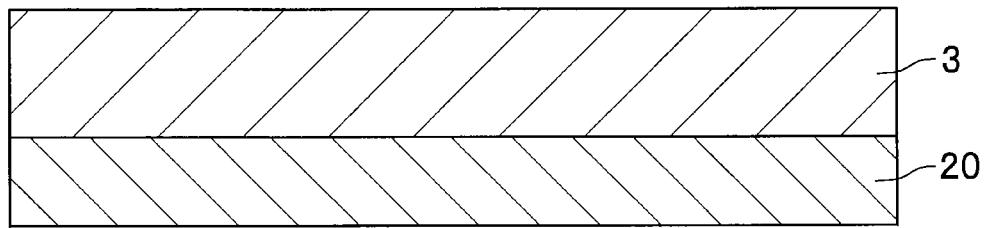
FIG. 3A is a sectional diagram showing a step of forming a wavelength conversion member on a sheet in the method of manufacturing a light emitting device according to the first embodiment.

The step S101 of forming a wavelength conversion member on a sheet is a step of forming the wavelength conversion member 3 on a sheet 20 formed using resin or the like as shown in FIG. 3A.

The wavelength conversion member 3 can be formed on the sheet 20 by, for example, a printing method, a compression molding method, or a method with which a plate-shaped wavelength conversion member is stacked.

Step of Disposing Light Emitting Element

Figure 3B:
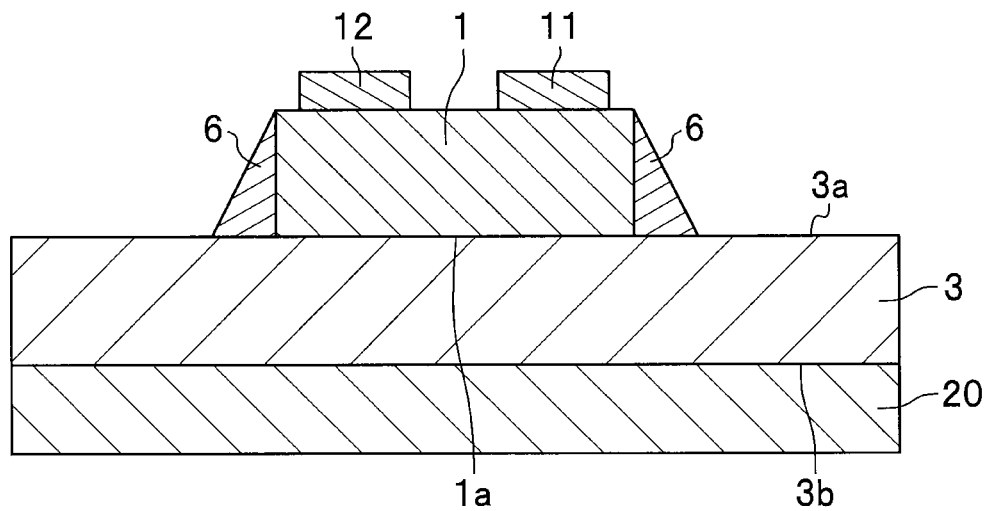
FIG. 3B is a sectional diagram showing a step of disposing a light emitting element in the method of manufacturing a light emitting device according to the first embodiment.

The step S102 of disposing a light emitting element is a step of disposing the light emitting element 1 on a first surface 3a of the wavelength conversion member 3 with the first surface 3a of the wavelength conversion member 3 facing the light emitting surface of the light emitting element 1a of the light emitting element 1 as shown in FIG. 3B. The wavelength conversion member 3 has the first surface 3a and a second surface 3b positioned opposite to the first surface 3a. In addition, the step S102 of disposing a light emitting element on the wavelength conversion member 3 includes a step of providing a light guide member 6 in such a manner as to cover at least a portion of the lateral surface of the light emitting element 1

In the step S102, a surface of the light emitting element 1 positioned opposite to a surface on which electrodes 11 and 12 are formed, in other words, the light emitting surface 1a, is bonded to the first surface 3a of the wavelength conversion member 3 with the bonding member interposed therebetween.

In this instance, adjusting the amount of the bonding member can allow the bonding member to creep up at least a portion of the lateral surfaces of the light emitting element 1, so that the bonding member is formed on the lateral surface of the light emitting element 1. Accordingly, the light emitting device 100 has a configuration in which the light guiding member 6 as a bonding member is provided on the lateral surfaces of the light emitting element 1.

In addition, the light guiding member 6 as a bonding member may be disposed with a predetermined thickness in the up-down direction between the light emitting surface 1a of the light emitting element 1 and the first surface 3a of the wavelength conversion member 3. Accordingly, the light emitting element 1 and the wavelength conversion member 3 can be firmly bonded to each other. In the present disclosure, the bonding member is interposed in an extremely thin state (not shown) between the light emitting surface 1a of the light emitting element 1 and the first surface 3a of the wavelength conversion member 3 for bonding the light emitting element 1 and the wavelength conversion member 3 to each other.

Step of Forming Recess on Wavelength Conversion Member

Figure 3C:
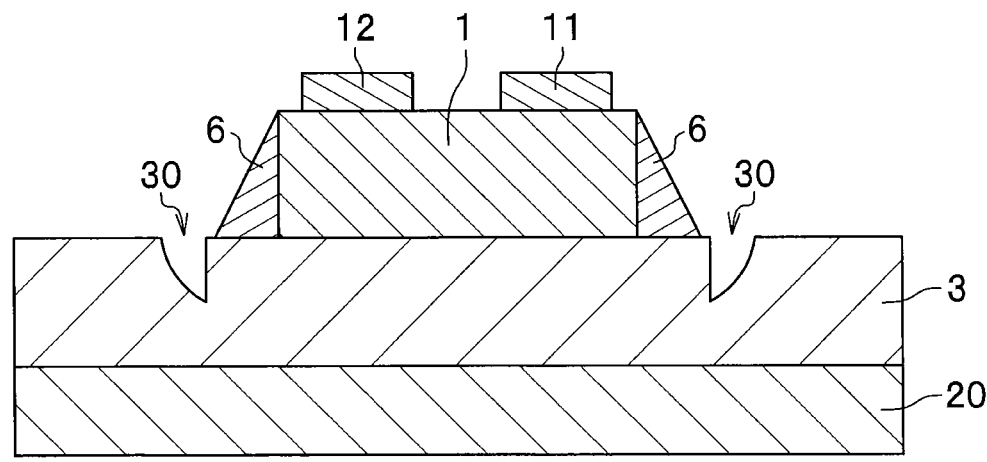
FIG. 3C is a sectional diagram showing a step of forming a recess on the wavelength conversion member in the method of manufacturing a light emitting device according to the first embodiment.

The step S103 of forming recess on the wavelength conversion member is a step of removing a part of the wavelength conversion member 3 on the periphery of the light guiding member 6 to form the recess 30 on the periphery of the light guiding member 6 as shown in FIG. 3C.

The recess 30 can be formed by, for example, removing a part of the wavelength conversion member 3 perpendicularly or inclinedly from the upper surface of the wavelength conversion member 3 toward the sheet 20 using a blade having a predetermined width and a predetermined shape.

The recess 30 may be formed by laser light or etching. When the recess 30 having a small depth as shown in FIG. 3C is formed, it is preferable to use a router. When the recess 30 is formed by laser light, a part of the wavelength conversion member reacted by laser light may be removed after the recess 30 is formed.

In addition, a part of the light guiding member 6 may be removed in forming the recess 30. In this instance, the recess 30 is preferably formed outward of the light guiding member 6 as shown in FIG. 3C in order to improve the light emitting efficiency. The recess 30 is formed such that a quadrangular annular portion surrounding the outer lateral surfaces of the outer edge of the light guiding member 6 is positioned inward of the outside surface of the wavelength conversion member 3.

Step of Disposing Reflecting Member

Figure 4A:
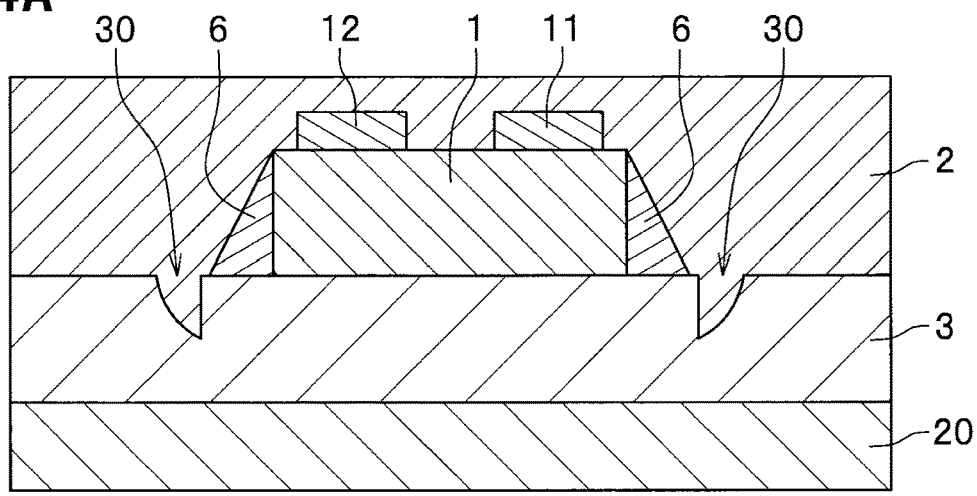
FIG. 4A is a sectional diagram showing a step of disposing a reflecting member in the method of manufacturing a light emitting device according to the first embodiment.

The step S104 of disposing the reflecting member is a step of supplying the reflecting member 2 in the recess 30 of the wavelength conversion member 3 and covering the light emitting element 1 and the light guiding member 6 as shown in FIG. 4A.

In the step S104, the reflecting member 2 is supplied in the recess 30 of the wavelength conversion member 3. In addition, in the step S104, the surfaces of the light emitting element 1 including electrodes 11 and 12, and the light guiding member 6 are covered with the reflecting member 2. In the step S104, the reflecting member 2 is provided in the recess 30 of the wavelength conversion member 3 and in a region from the surface of the wavelength conversion member 3 to the upper surfaces of electrodes 11 and 12.

Supplying the reflecting member 2 in the recess 30 and covering the light emitting element 1 and the light guiding member 6 with the reflecting member 2 can be performed using, for example, a discharge device (i.e., dispenser) which can be vertically or horizontally moved with respect to the sheet 20 above the fixed sheet 20. Supplying and covering with the reflecting member 2 can be performed by supplying the reflecting member 2 in the recess 30 of the wavelength conversion member 3 and the top of the wavelength conversion member 3 with a resin or the like that forms the reflecting member 2 using the discharge device.

Covering can be performed by a compression molding method, a transfer molding method or the like.

Step of Exposing Electrode

Figure 4B:
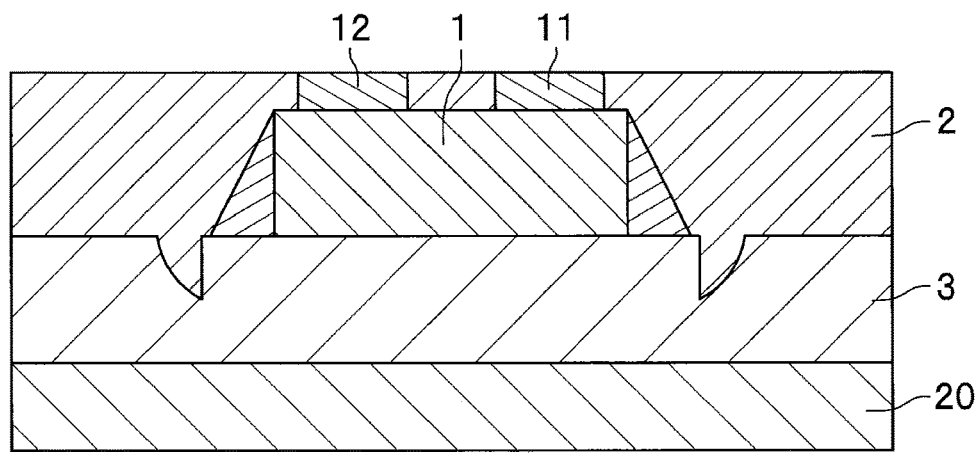
FIG. 4B is a sectional diagram showing a step of exposing electrodes from the reflecting member in the method of manufacturing a light emitting device according to the first embodiment.

The step S105 of exposing electrodes is a step of removing a part of the reflecting member 2 on the side of electrodes 11 and 12 so as to expose electrodes 11 and 12 of the light emitting element 1 as shown in FIG. 4B.

In the step S105, for example, the surface of the reflecting member 2 is removed from the side of electrodes 11 and 12 until electrodes 11 and 12 are exposed. Examples of the method for removing the reflecting member 2 include grinding, polishing and blasting.

Step of Cutting

Figure 4C:
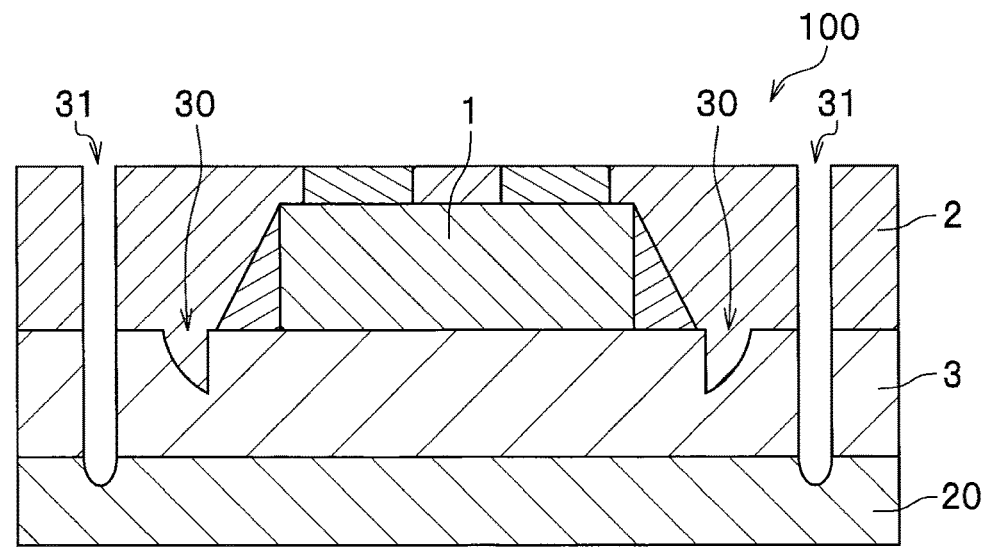
FIG. 4C is a sectional diagram showing a step of cutting for each device in the method of manufacturing a light emitting device according to the first embodiment.

The Step S106 of cutting is a step of cutting a collective body of light emitting devices 100 as shown in FIG. 4C. That is, the step S106 is a step of dividing the collective body of light emitting devices 100.

In the step S106, a cut groove 31 formed in portions for dividing the collective body of light emitting devices 100 is preset such that the sizes of light emitting devices 100 are substantially equal.

The collective body can be divided by, for example, removing a part of the reflecting member 2 and a part of the wavelength conversion member 3 in the thickness direction to form the cut groove 31 such that one light emitting element 1 is surrounded. Preferably, the cut groove 31 is formed so as to reach a portion of the sheet 20.

The cut groove 31 can be formed by a known method such as a dicing method with which the collective body is cut by a blade.

A plurality of light emitting devices 100 is obtained by dividing the collective body.

When a plurality of light emitting elements 1 is disposed on the sheet 20, the cut groove 31 may be formed so as to surround one light emitting element 1, or formed so as to surround a plurality of light emitting elements 1.

Figure 16A:
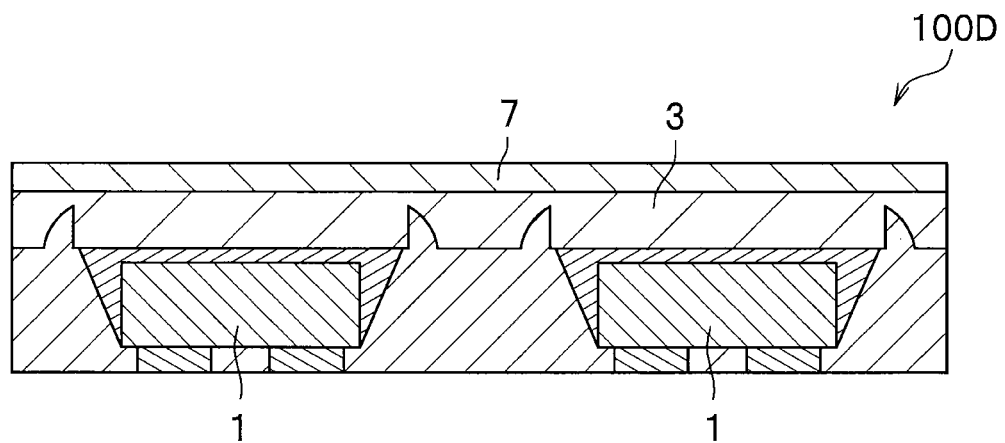
FIG. 16A is a sectional view schematically showing a configuration of a light emitting device according to another embodiment.

To obtain a light emitting device 100D as shown in FIG. 16A, for example, the recess 30 can be formed so as to surround one light emitting element 1, the cut groove 31 can be formed so as to surround two light emitting elements, and cutting is performed by the cut groove 31 for every two light emitting elements 1.

Figure 16B:
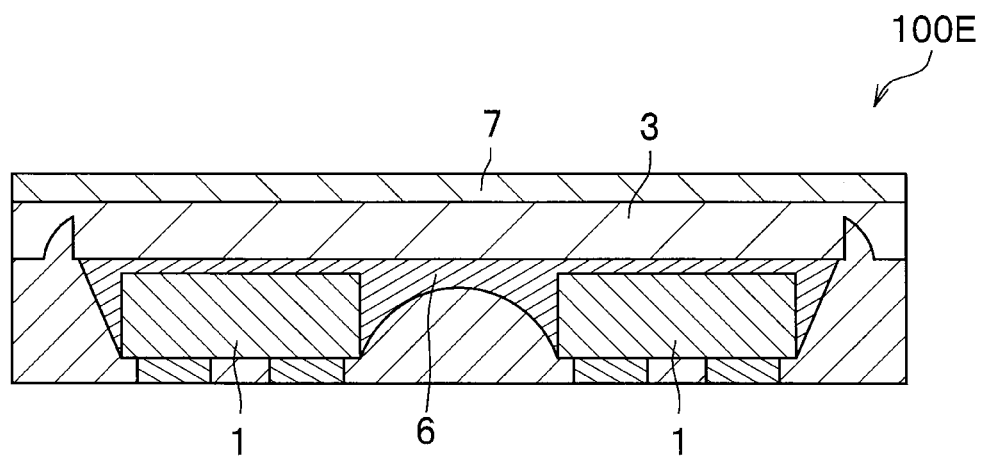
FIG. 16B is a sectional view schematically showing a configuration of a light emitting device according to another embodiment.

To obtain a light emitting device 100E as shown in FIG. 16B, for example, the recess 30 and the cut groove 31 are formed so as to surround two light emitting elements 1, and cutting is performed by the cut groove 31 for every two light emitting elements 1.

Second Embodiment

Light Emitting Device

A light emitting device according to a second embodiment will now be described.

Figure 5:
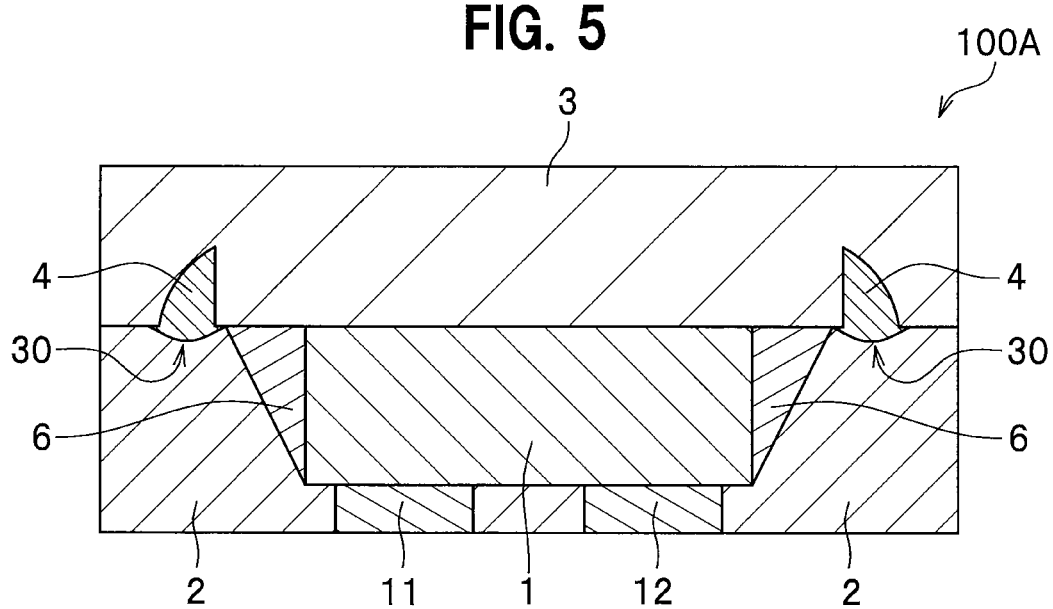
FIG. 5 is a sectional view schematically showing a configuration of a light emitting device according to a second embodiment.

As shown in FIG. 5, a light emitting device 100A includes a light emitting element 1, a first reflecting member 2, a wavelength conversion member 3, a second reflecting member 4 and a light guiding member 6.

Here, aspects of the second embodiment different from the first embodiment will mainly be described.

In the second embodiment, the reflecting member includes the first reflecting member 2 provided on lateral surfaces of the light emitting element 1, and the second reflection member 4 provided in a recess 30.

The first reflecting member 2 is the same as the reflecting member described in the first embodiment except that the first reflecting member 2 is not essentially provided in the recess 30 of the wavelength conversion member 3. A portion in the recess 30 in which the second reflecting member 4 is provided corresponds to the frame-shaped protruding portion 2A described in the first embodiment.

The second reflecting member 4 is a different component from the first reflecting member 2, and is provided in the recess 30 of the wavelength conversion member 3. The "different component" means that the first reflecting member 2 and the second reflecting member 4 are provided as different members.

The second reflecting member 4 may be a reflecting member identical to or different from the first reflecting member 2. The second reflecting member 4 may contain a filler or the like different from that in the first reflecting member 2.

The second reflecting member 4 may contain a coloring substance. Containing a coloring substance in the second reflecting member 4 can easily make the color of the entire upper surface of the light emitting device 100 substantially identical to the color of the wavelength conversion member 3 during a light-emission period.

The coloring substance contains one of a pigment and a dye.

Examples of the pigment include pigments using an inorganic material or an organic material, and examples of the material to be used for the pigment are as follows, but are not particularly limited thereto.

Examples of the inorganic material include red iron oxide ($Fe_2O_3$), red lead ($Pb_3O_4$), titanium nickel antimony-based oxide, titanium nickel barium-based oxide, titanium chromium antimony-based oxide and titanium chromium niobium-based oxide.

Examples of the organic material include anthraquinone-based materials, azo-based materials, quinacridone-based materials, perylene-based materials, diketo-pyroro-pyrrole-based materials, monoazo-based materials, disazo-based materials, pyrazolone-based materials, benzimidazolone-based materials, quinoxaline-based materials, azomethine-based materials, isoindolinone-based materials and isoindolin-based materials.

Examples of the dye include anthraquinone-based dyes, methine-based dyes, azomethine-based dyes, oxazine-based dyes, azo-based dyes, styryl-based dyes, coumarin-based dyes, porphyrin-based dyes, dibenzofuranone-based dyes, diketo-pyroro-pyrrole-based dyes, rhodamine-based dyes, xanthene-based dyes and pyrromethene-based dyes, but are not particularly limited thereto.

The pigment and the dye are each preferably one that does not essentially convert light from the light emitting element 1 into light having a different wavelength.

Method of Manufacturing Light Emitting Device

One example of a method of manufacturing the light emitting device 100A according to the second embodiment will now be described with reference to FIGS. 6 to 9B. FIGS. 7A to 9B schematically show one light emitting device 100A at the time of manufacturing a plurality of light emitting devices 100A at once.

Figure 6:
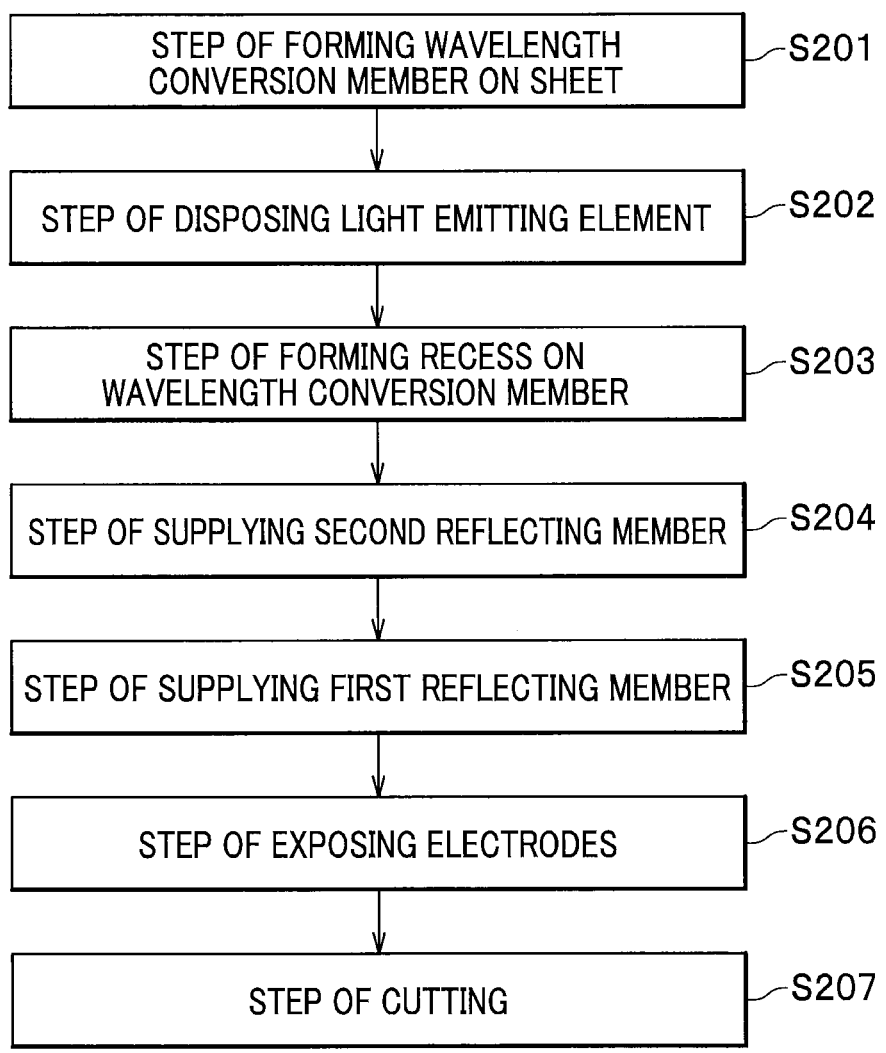
FIG. 6 is a flow chart of a method of manufacturing a light emitting device according to the second embodiment.
Figure 7A:
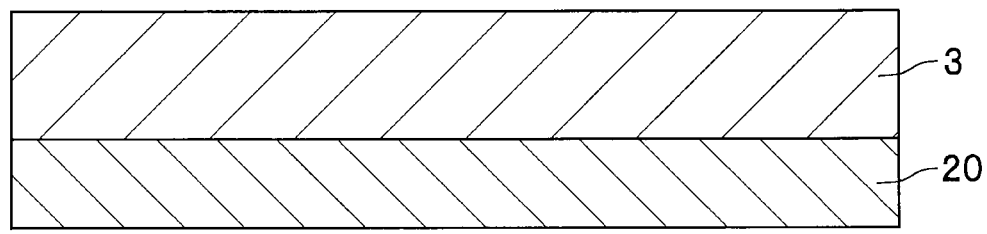
FIG. 7A is a sectional diagram showing a step of forming a wavelength conversion member on a sheet in the method of manufacturing a light emitting device according to the second embodiment.
Figure 7B:
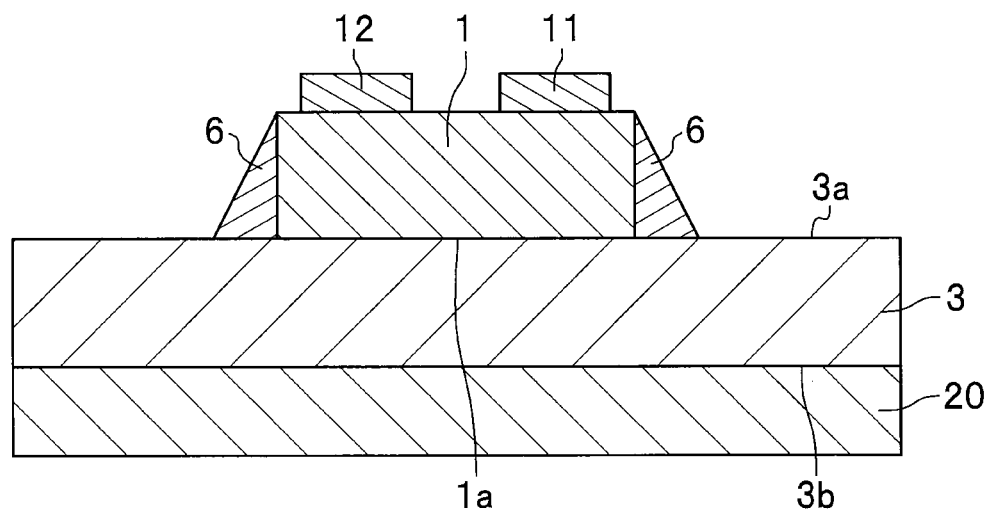
FIG. 7B is a sectional diagram showing a step of disposing a light emitting element in the method of manufacturing a light emitting device according to the second embodiment.
Figure 7C:
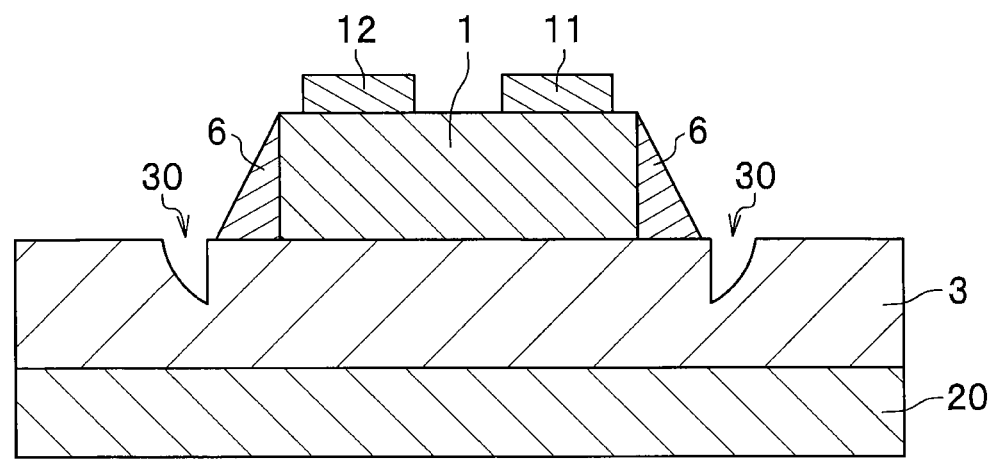
FIG. 7C is a sectional diagram showing a step of forming at least one recess on the wavelength conversion member in the method of manufacturing a light emitting device according to the second embodiment.

As shown in FIG. 6, the method of manufacturing the light emitting device 100A according to the second embodiment includes a step S201 of forming a wavelength conversion member on a sheet, a step S202 of disposing a light emitting element, a step S203 of forming a recess on the wavelength conversion member, a step S204 of supplying a second reflecting member, a step S205 of supplying a first reflecting member, a step S206 of exposing electrodes, and a step S207 of cutting.

The materials, arrangements and the like of the members are essentially the same as described above for the light emitting devices 100 and 100A, and therefore descriptions thereof are appropriately omitted here.

As shown in FIGS. 7A to 7C, 9A and 9B, a step S201 of forming a wavelength conversion member on a sheet, a step S202 of disposing a light emitting element, a step S203 of forming a recess on the wavelength conversion member, a step S206 of exposing electrodes and a step S207 of cutting can be performed in the same manner as to, respectively, a step S101 of forming a wavelength conversion member on a sheet, a step S102 of disposing a light emitting element, a step S103 of forming a recess on the wavelength conversion member, a step S105 of exposing electrodes and a step S106 of cutting as described above in the method of manufacturing the light emitting device 100.

Here, as steps of disposing reflecting members, the step S204 of supplying a second reflecting member and a step S205 of supplying a first reflecting member will be described.

Step of Supplying Second Reflecting Member

The step S204 of supplying a second reflecting member is a step of supplying the second reflecting member 4 in the recess 30 of the wavelength conversion member 3 as shown in FIG. 8A.

The second reflecting member 4 can be supplied by, for example, a printing method or a compression molding method. In addition, the second reflecting member 4 can be supplied using the resin discharge device.

Step of Supplying First Reflecting Member

The step S205 of supplying a first reflecting member is a step of covering the first light emitting element 1, the light guiding member 6 and the second reflecting member 4 with the first reflecting member 2 as shown in FIG. 8B.

In the step S205, not only the light emitting element 1 and the light guiding member 6, but also the second reflecting member 4 provided in the recess 30 of the wavelength conversion member 3 is covered with the first reflecting member 2. Except for this, the step can be performed in the same manner as to the step S104 of supplying a reflecting member as described above in the method of manufacturing the light emitting device 100.

Figure 9A:
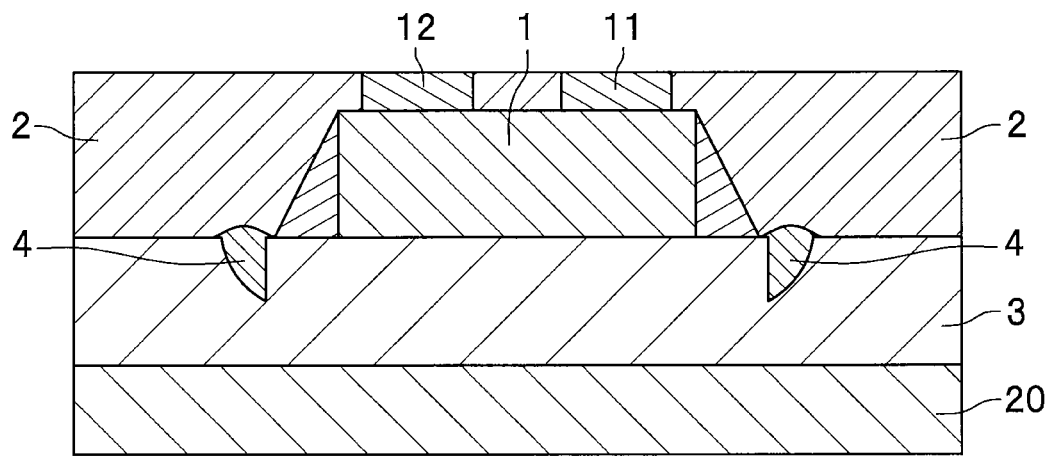
FIG. 9A is a sectional diagram showing a step of exposing electrodes from the first reflecting member in the method of manufacturing a light emitting device according to the second embodiment.

The step S206 of exposing the electrodes is a step of removing a part of the first reflecting member 2 on the side of electrodes 11 and 12 so as to expose the electrodes 11 and 12 of the light emitting element 1 as shown in FIG. 9A. For details, the step can be performed in the same manner as to the step S105 of exposing electrodes as described above in the method of manufacturing the light emitting device 100.

Figure 9B:
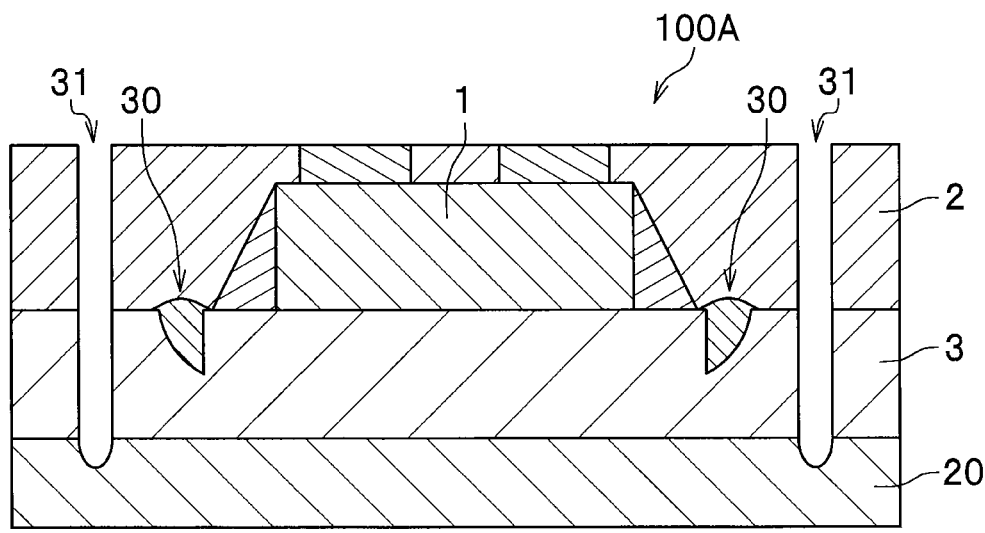
FIG. 9B is a sectional diagram showing a step of cutting for each device in the method of manufacturing a light emitting device according to the second embodiment.

The step S207 of cutting is a step of cutting a collective body of light emitting devices 100A as shown in FIG. 9B. For details, the step can be performed in the same manner as to the step S106 of cutting as described above in the method of manufacturing the light emitting device 100.

Third Embodiment

Light Emitting Device

A light emitting device according to a third embodiment will now be described.

Figure 10:
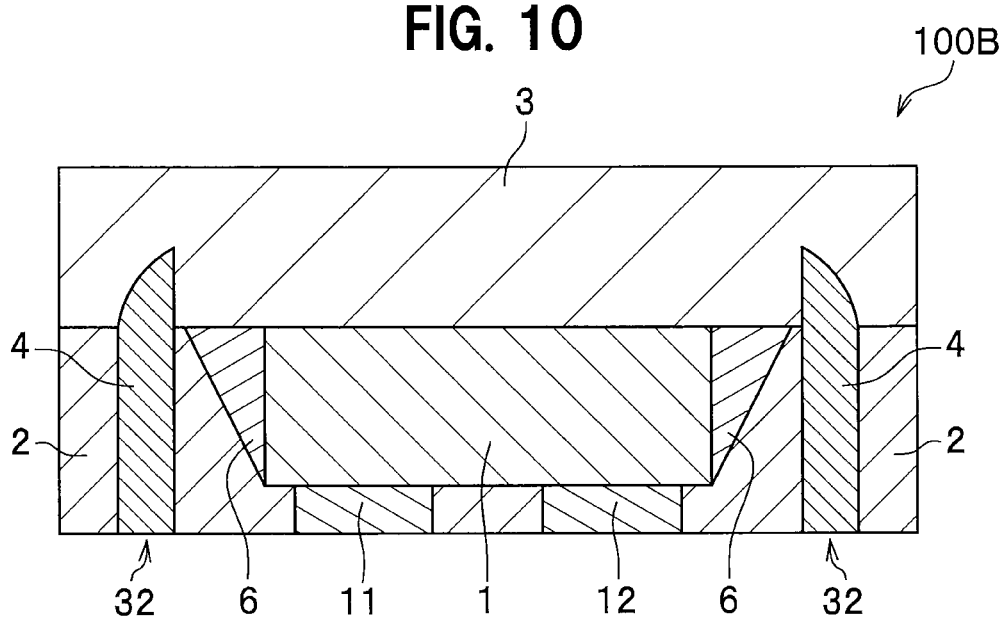
FIG. 10 is a sectional view schematically showing a configuration of a light emitting device according to a third embodiment.

As shown in FIG. 10, a light emitting device 100B includes a first light emitting element 1, a first reflecting member 2, a wavelength conversion member 3, a second reflecting member 4 and a light guiding member 6.

Here, aspects of the third embodiment mainly different from the second embodiment will be described.

The second reflecting member 4 is provided so as to pass through the first reflecting member 2. The first reflecting member 2 is provided with a through-hole communicating with a recess of the wavelength conversion member 3, and the through-hole and the recess of the wavelength conversion member 3 are integrated to form a recess 32. The second reflecting member 4 is provided in the recess of the wavelength conversion member 3, and provided in the through-hole of the first reflecting member 2. Accordingly, the second reflecting member 4 is provided in the recess 32 such that the second reflecting member 4 in the recess of the wavelength conversion member 3 and the second reflecting member 4 in the through-hole of the first reflecting member 2 are integrally formed. Here, the recess 32 extends to the outside surface of the light emitting device 100 at the four corners of a quadrangular annular portion surrounding the outer lateral surfaces of the outer edge of the light guiding member 6. The recess of the wavelength conversion member 3 corresponds to the recess 30 described in the first embodiment, and a portion in the recess of the wavelength conversion member 3, which is provided with the second reflecting member 4, corresponds to the frame-shaped protruding portion 2A described in the first embodiment.

Method of Manufacturing Light Emitting Device

One example of a method of manufacturing the light emitting device 100B according to the third embodiment will now be described with reference to FIGS. 11 to 14B. FIGS. 12A to 14B schematically show one light emitting device 100B at the time of manufacturing a plurality of light emitting devices 100B at once.

Figure 11:
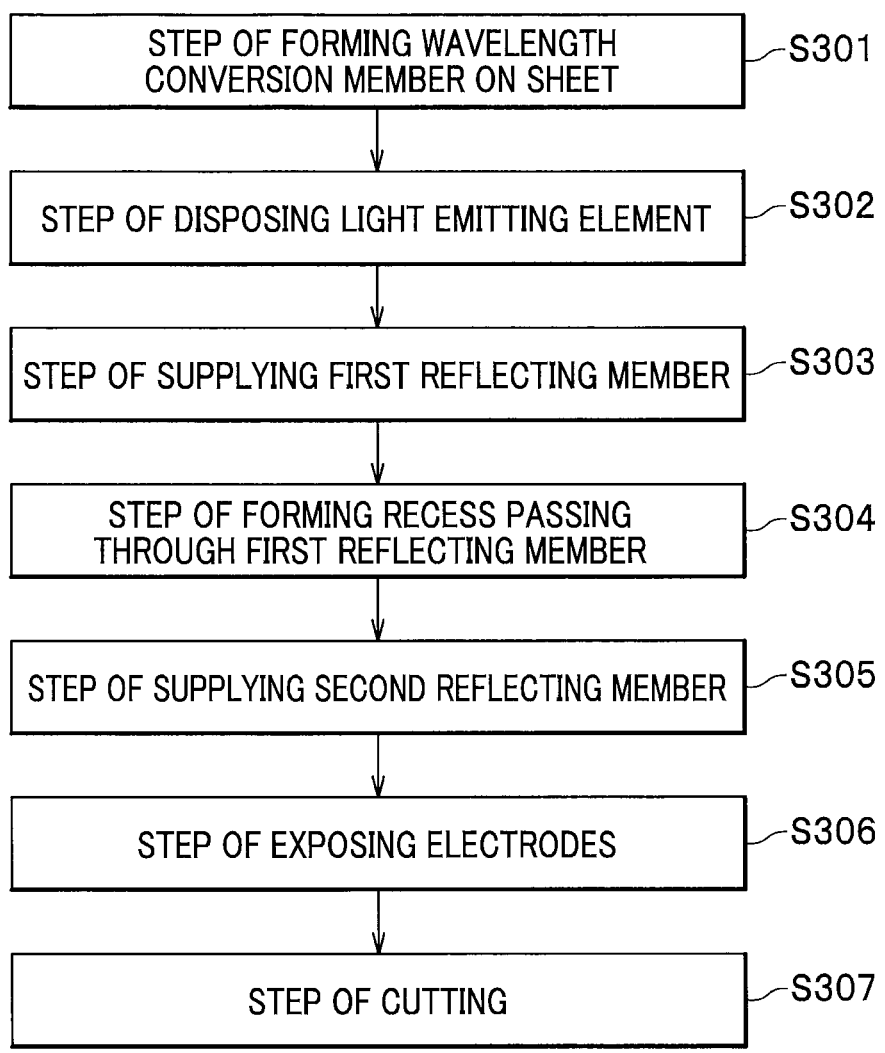
FIG. 11 is a flow chart of a method of manufacturing a light emitting device according to the third embodiment.

As shown in FIG. 11, the method of manufacturing the light emitting device 100B according to the third embodiment includes a step S301 of forming a wavelength conversion member on a sheet, a step S302 of disposing a light emitting element, a step S303 of supplying a first reflecting member, a step S304 of forming a recess passing through the first reflecting member, a step S305 of supplying a second reflecting member, a step S306 of exposing electrodes, and a step S307 of cutting.

The materials, arrangements and the like of the members are essentially the same as described above for the light emitting devices 100, 100A and 100B, and therefore descriptions thereof are appropriately omitted here.

Figure 12A:
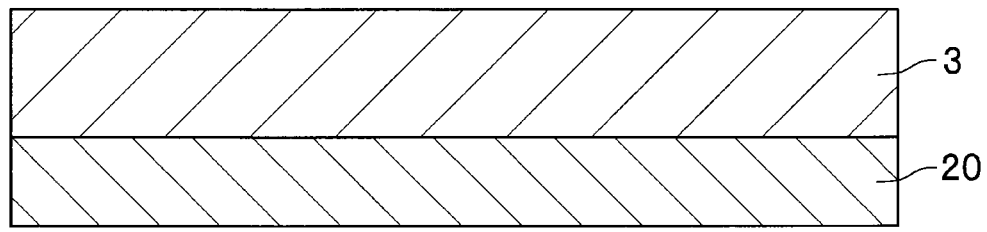
FIG. 12A is a sectional diagram showing a step of forming a wavelength conversion member on a sheet in the method of manufacturing a light emitting device according to the third embodiment.
Figure 12B:
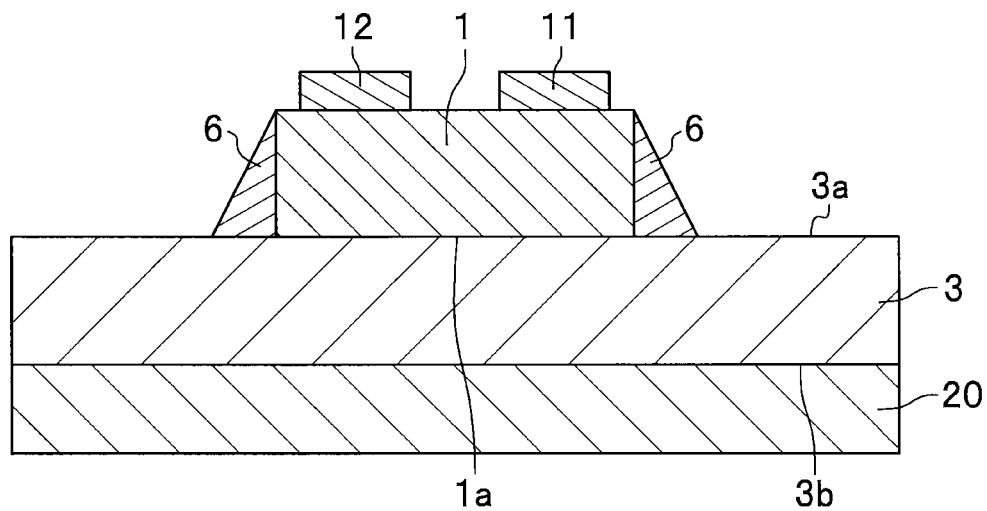
FIG. 12B is a sectional diagram showing a step of disposing a light emitting element in the method of manufacturing a light emitting device according to the third embodiment.

As shown in FIGS. 12A and 12B, the step S301 of forming a wavelength conversion member on a sheet and the step S302 of disposing a light emitting element can be performed in the same manner as to, respectively, the step S101 of forming a wavelength conversion member on a sheet and the step S102 of disposing a light emitting element as described above in the method of manufacturing the light emitting device 100.

Here, the step S303 of supplying a first reflecting member, the step S304 of forming a recess passing through the first reflecting member, the step S305 of supplying a second reflecting member, the step S306 of exposing electrodes, and the step S307 of cutting will be described.

Step of Supplying First Reflecting Member

Figure 12C:
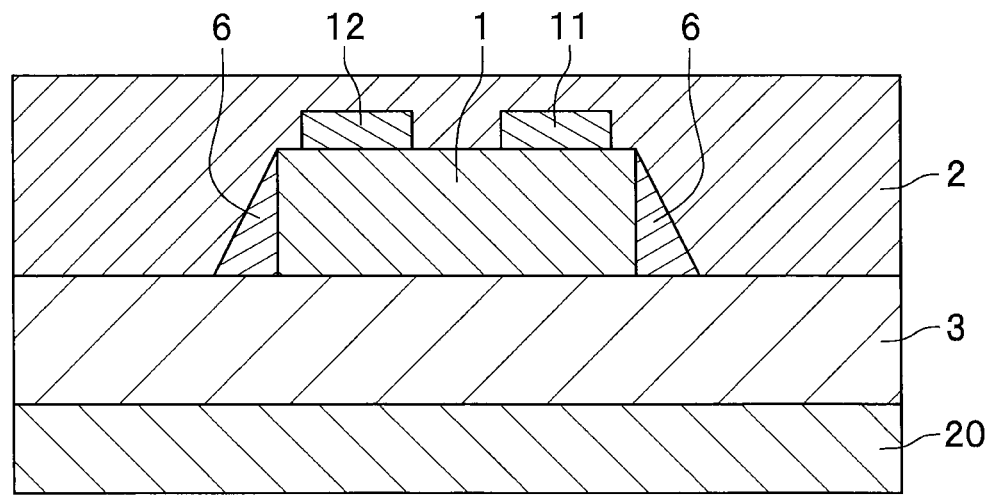
FIG. 12C is a sectional diagram showing a step of covering the light emitting element and the like with a first reflecting member in the method of manufacturing a light emitting device according to the third embodiment.

The step S303 of supplying a first reflecting member is a step of covering the light emitting element 1 and the light guiding member 6 with the first reflecting member 2 as shown in FIG. 12C.

In the step S303, no recess is formed on the wavelength conversion member 3 at this time, and therefore the first reflecting member 2 is provided on the wavelength conversion member 3 being provided with no recess. Except for this, the step can be performed in the same manner as to the step S104 of disposing a reflecting member as described above in the method of manufacturing the light emitting device 100.

Step of Forming Recess Passing Through First Reflecting Member

Figure 13A:
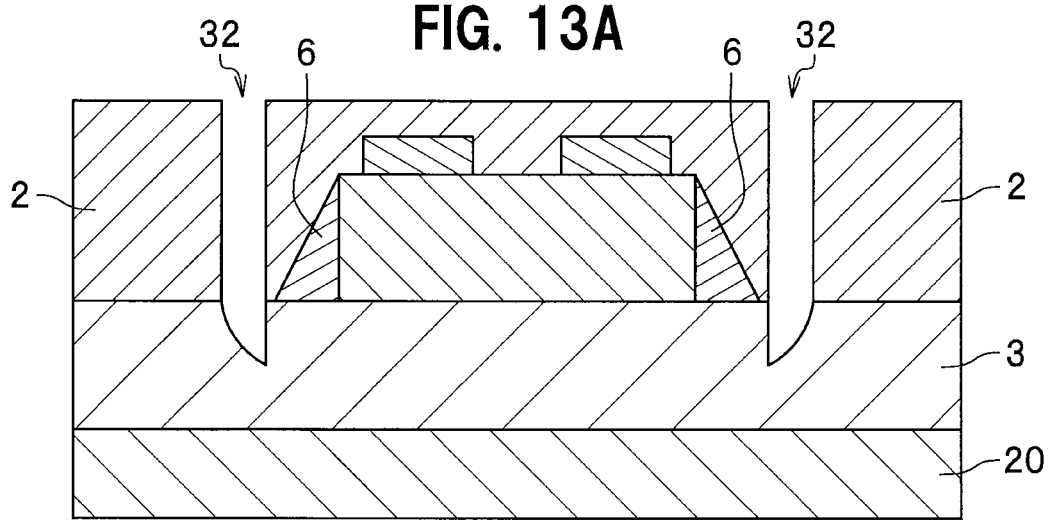
FIG. 13A is a sectional diagram showing a step of forming a recess passing through the first reflecting member in the method of manufacturing a light emitting device according to the third embodiment.

The step S304 of forming a recess passing through the first reflecting member is a step of forming the recess 32 piercing through the first reflecting member 2 on the periphery of the light guiding member 6 as shown in FIG. 13A.

In the step S304, the first reflecting member 2 on the periphery of the light guiding member 6 is pierced, and a part of the wavelength conversion member 3 is removed. Accordingly, the recess 32 passing through the first reflecting member 2 is formed on the periphery of the light guiding member 6.

The recess 32 can be formed by, for example, removing the first reflecting member 2 perpendicularly or inclinedly from the upper surface of the first reflecting member 2 toward the sheet 20 using a blade having a predetermined width and a predetermined shape. The recess 32 can be formed by piercing the first reflecting member 2, and removing a part of the wavelength conversion member 3.

The recess 32 having a large depth as shown in FIG. 13A can be formed by laser light or dicing. However, dicing is preferable to form the recess 32.

In addition, the recess 32 may be formed so as to remove a part of the light guiding member 6. For improving light emitting efficiency, the recess 32 is preferably formed outward of the light guiding member 6 as shown in FIG. 13A. In addition, the recess 32 is formed such that a quadrangular annular portion surrounding the outer lateral surfaces of the outer edge of the light guiding member 6 is positioned inward of the outer lateral surface of the wavelength conversion member 3

Step of Supplying Second Reflecting Member

Figure 13B:
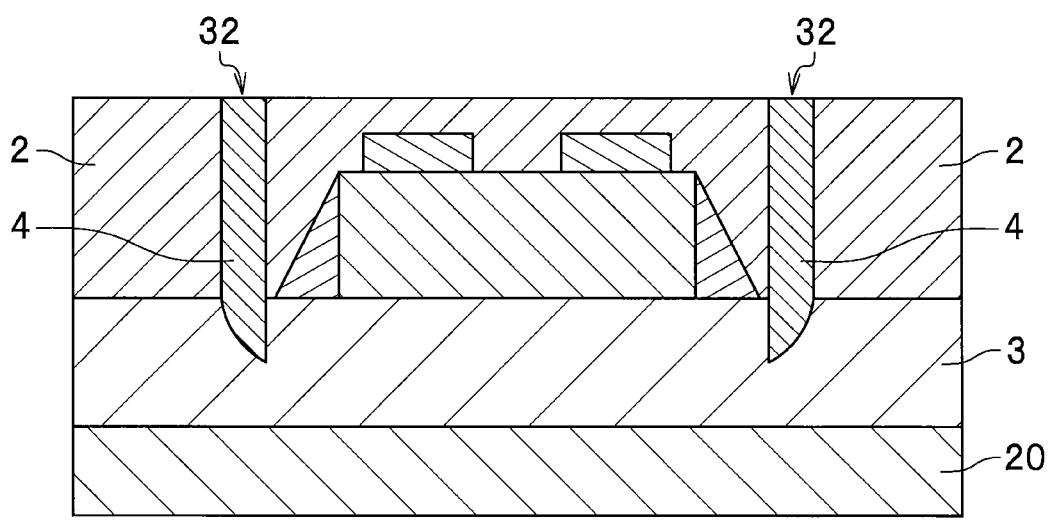
FIG. 13B is a sectional diagram showing a step of supplying a second reflecting member into the recess passing through the first reflecting member in the method of manufacturing a light emitting device according to the third embodiment.

Step S305 of supplying a second reflecting member is a step of supplying the second reflecting member 4 in the recess 32 as shown in FIG. 13B.

The second reflecting member 4 can be supplied by, for example, a printing method or a compression molding method. In addition, the second reflecting member 4 can be supplied using the resin discharge device.

Step of Exposing Electrode

Figure 14A:
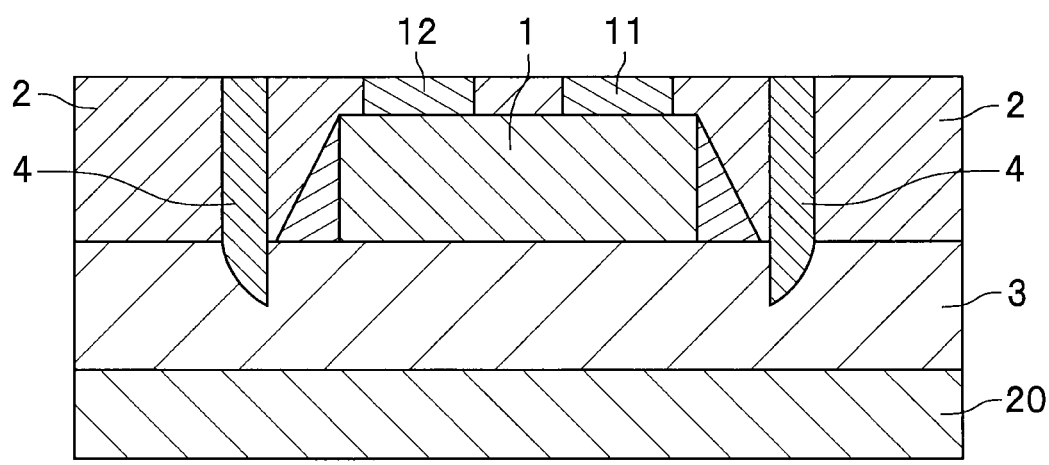
FIG. 14A is a sectional diagram showing a step of exposing electrodes from the first reflecting member in the method of manufacturing a light emitting device according to the third embodiment.

The step S306 of exposing electrodes is a step of removing a part of the first reflecting member 2 and a part of the second reflecting member 4 on the side of electrodes 11 and 12 so as to expose electrodes 11 and 12 of the light emitting element 1 as shown in FIG. 14A.

In the step S306, for example, the surfaces of the first reflecting member 2 and the second reflecting member 4 are removed from the side of electrodes 11 and 12 until electrodes 11 and 12 are exposed. Examples of the method for removing the first reflecting member 2 and the second reflecting member 4 include grinding, polishing and blasting.

Step of Cutting

Figure 14B:
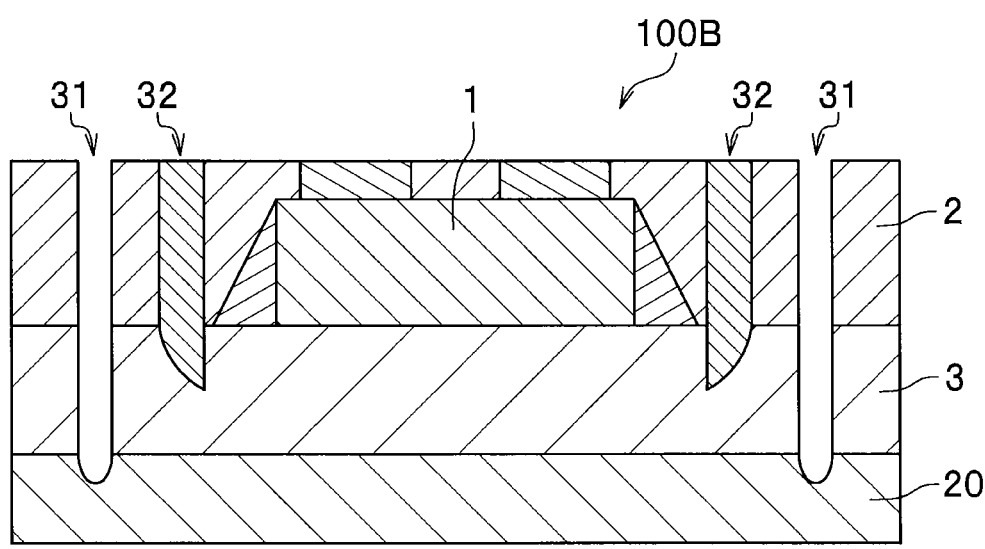
FIG. 14B is a sectional diagram showing a step of cutting for each device in the method of manufacturing a light emitting device according to the third embodiment.

The step S307 of cutting is a step of cutting a collective body of light emitting devices 100B as shown in FIG. 14B.

In the step S307, the collective body of light emitting devices 100B is cut at a portion on the periphery of the recess 32 where the cut groove 31 is formed. Except for this, the step can be performed in the same manner as to the step S106 described above in the method of manufacturing the light emitting device 100.

The light emitting devices and methods of manufacturing a light emitting device according to the embodiments have been described in more detail in "DETAILED DESCRIPTION OF EMBODIMENTS". However, the spirit of the present disclosure is not limited to the described embodiments, and should be broadly interpreted on the basis of the descriptions of claims. In addition, various changes and modifications made on the basis of these descriptions are included in the spirit of the present disclosure.

Hereinafter, other embodiments will be described.

Figure 15:
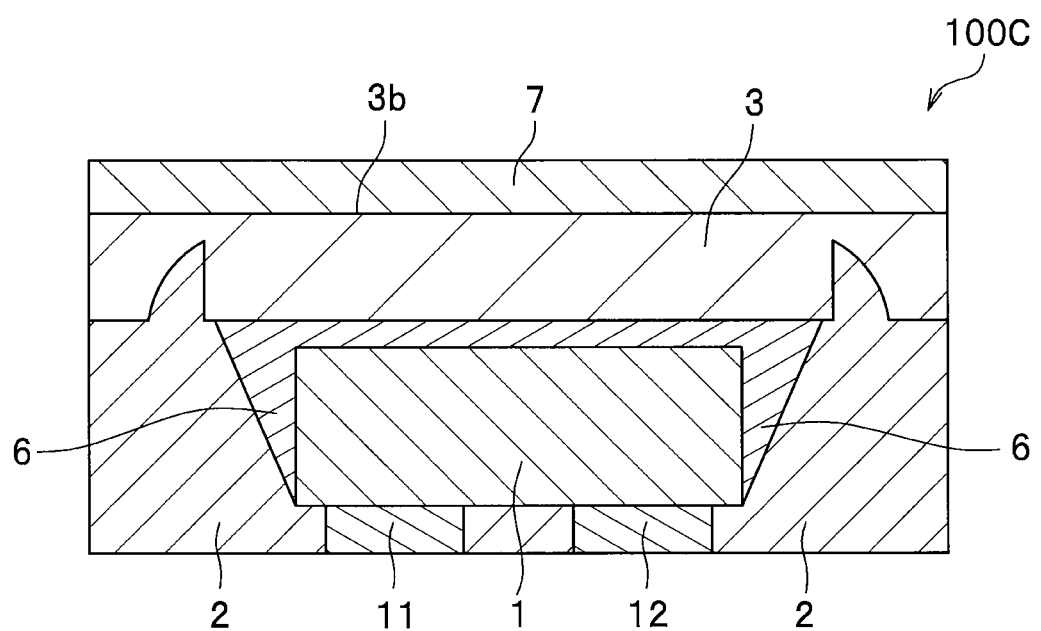
FIG. 15 is a sectional view schematically showing a configuration of a light emitting device according to another embodiment.

The light guiding member 6 may be provided not only on the lateral surfaces of the light emitting element 1 but also between the light emitting element 1 and the wavelength conversion member 3 as in a light emitting device 100C shown in FIG. 15. In this case, the thickness of the light guiding member 6 in the up-down direction is preferably 0.5 µm or more and 20 µm or less, more preferably 0.5 µm or more and 10 µm or less, from the viewpoint of firmly bonding the light emitting element 1 to the wavelength conversion member 3 and improving luminous flux and light extraction efficiency. In addition, the number of the light emitting elements 1 provided may be one or more. In addition, the light emitting device may be provided with a disposing substrate on which the light emitting device 100 is mounted.

The wavelength conversion member 3 does not necessarily have a single-layer structure, and may have a multilayer structure. The wavelength conversion member 3 may be one obtained by stacking a plurality of wavelength conversion members containing different wavelength conversion substances. The wavelength conversion member 3 may include a light transmitting layer substantially free from a wavelength conversion substance. A light transmitting layer substantially free from the wavelength conversion member 3, a layer containing at least one diffusing agent, a layer having rough surface, a light transmitting member such as a convex lens, and so on may be stacked on the wavelength conversion member 3. In FIG. 15, a light transmitting layer 7 is stacked on the wavelength conversion member 3. The light transmitting layer 7 disposed on the wavelength conversion substance can protect from the external environment.

When the wavelength conversion member 3 is a layered body, and includes a light transmitting layer substantially free from a wavelength conversion substance, it is preferable to dispose the light transmitting layer 7 on a second surface 3b of the wavelength conversion member 3 as in FIG. 15. In this case, the light transmitting layer 7 may configure a part of the wavelength conversion member 3, or may configure a layer substantially free from a wavelength conversion substance so as to configure a different member from the wavelength conversion member 3 containing a wavelength conversion substance. By disposing the light transmitting layer 7 on the second surface 3b of the wavelength conversion member 3, the wavelength conversion substance can be protected from the external environment with the light transmitting layer 7 serving as a protective layer at the time when the sheet 20 is removed to obtain the light emitting device 100C.

The light transmitting layer 7 is a transparent member, and examples of the material for the light transmitting layer 7 include light-transmissive resins such as resins usable for the wavelength conversion member 3, and glass.

When the light transmitting layer 7 substantially free from a wavelength conversion substance is provided on the second surface 3b side of the wavelength conversion member 3 in the step of forming a wavelength conversion member, the upper surface of the light emitting device can be easily adjusted.

Specifically, a change in emission color and a change in body color of the wavelength conversion member 3 are less likely to occur by removing a part of the light transmitting layer 7 substantially free from a wavelength conversion substance, but not removing the wavelength conversion member 3 in adjustment of the upper surface of the light emitting device.

Figure 17A:
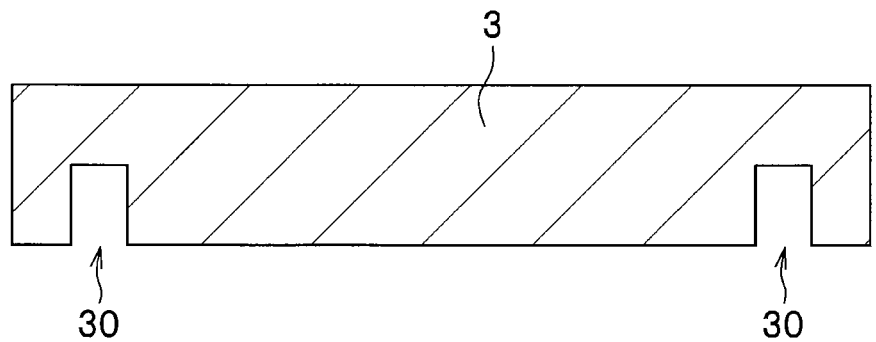
FIG. 17A is a sectional view schematically showing another shape of a recess on a wavelength conversion member.
Figure 17B:
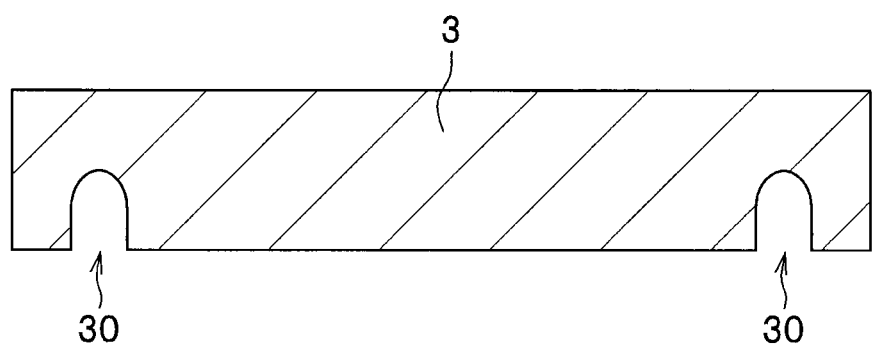
FIG. 17B is a sectional view schematically showing another shape of a recess on a wavelength conversion member.

The shape of the recess 30 of the wavelength conversion member 3 can be appropriately determined. For example, as shown in FIG. 17A, the recess 30 may have a quadrangular shape in sectional view. Alternatively, as shown in FIG. 17B, the recess 30 may have a shape having an arc-shaped upper surface in sectional view. Alternatively, as shown in FIG. 17C, the recess 30 may have a rectangular shape in sectional view.

When the recess 30 has a shape as in FIGS. 17A and 17B, an intensely light-emitting region and a slightly light-emitting region can be set with respect to, for example, an extended line from an inside (i.e., light guiding member 6-side) surface of the recess 30. When the recess 30 has a rectangular shape as in FIG. 17C, an intensely light-emitting region and a slightly light-emitting region can be set with respect to, for example, an extended line perpendicular to the light emitting surface of the light emitting element 1 from a vertex of the triangle.

The recess 30 can be turned to various shapes by, for example, changing the shape of a blade.

Figure 17C:
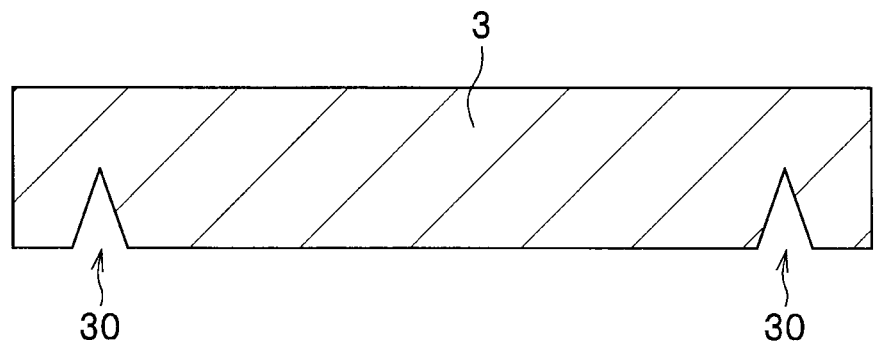
FIG. 17C is a sectional view schematically showing another shape of a recess on a wavelength conversion member.

The shape of the recess of the wavelength conversion member 3 in the recess 32 according to the third embodiment can be appropriately determined, and may be, for example, a shape shown in FIGS. 17A to 17C.

In the method of manufacturing the light emitting device 100 according to the first embodiment, the step S103 of forming a recess on a wavelength conversion member is performed after the step S102 of disposing a light emitting element, but the present disclosure does not require this order. The light emitting element 1 may be disposed on the wavelength conversion member 3 after the recess 30 is formed on the wavelength conversion member 3. Similarly in the method of manufacturing the light emitting device 100A according to the second embodiment, the light emitting element 1 may be disposed on the wavelength conversion member 3 after the recess 30 is formed on the wavelength conversion member 3. In addition, in the method of manufacturing the light emitting device 100A according to the second embodiment, the recess 30 is formed on the wavelength conversion member 3, and then filled with the second reflecting member 4, thereafter the light emitting element 1 may be disposed on the wavelength conversion member 3.

While the shape of the frame-shaped protruding portion 2A in plan view is a quadrangular annular shape, the present disclosure does not require the shape thereof. The frame-shaped protruding portion 2A may be formed in a circular annular shape surrounding the outer lateral surfaces of the outer edge of the light guiding member 6 in plan view. The frame-shaped protruding portion 2A may be formed in a continuous annular shape or an intermittent annular shape. More preferably, the frame-shaped protruding portion 2A has a shape the same as or similar to the outer shape of the light emitting element 1 in plan view.

Recesses 30 and 32 may be formed in a circular ring shape surrounding the outside of the outer edge of the light guiding member 6 in plan view as in the case of the frame-shaped protruding portion 2A. In addition, recesses 30 and 32 may be formed in a continuous ring shape or an intermittent ring shape. More preferably, recesses 30 and 32 have a shape analogous to the shape of the light emitting element 1.

The frame-shaped protruding portion 2A may have no extending portion 2B. Similarly, recesses 30 and 32 may have no portion corresponding to the extending portion 2B.

In addition, there may be a gap between the frame-shaped protruding portion 2A and the wavelength conversion member 3. In this case, the gap is positioned on the outer lateral surface side of the wavelength conversion member 3, and the frame-shaped protruding portion 2A is disposed on the light guiding member 6 side. For example, in the recess 30 and a portion of the recess 32 in the wavelength conversion member 3, the reflecting member 2 or the second reflecting member 4 is provided on the light guiding member 6 side, and a gap is positioned on the outer lateral surface side of the wavelength conversion member 3. In the through-hole in the recess 32 in the third embodiment, a gap is positioned on the outer lateral surface side of the first reflecting member 2.

The method of manufacturing a light emitting device may include other steps between, before and/or after the above-mentioned steps as long as the above-mentioned steps are not adversely affected. For example, a contaminant removing step of removing contaminants entering during manufacturing may be performed.

The light emitting devices according to the embodiments of the present disclosure can be used for various lighting devices such as flashlights for cameras, and general lighting.

The invention claimed is:

1. A method of manufacturing a light emitting device, the method comprising:
    disposing a light emitting element on a wavelength conversion member such that a light emitting surface of the light emitting element faces a first surface of the wavelength conversion member opposite to a second surface of the wavelength conversion member, while providing a light guiding member so as to cover at least a portion of lateral surfaces of the light emitting element;
    forming a recess at a periphery of the light guiding member by removing a part of the wavelength conversion member at the periphery of the light guiding member; and
    disposing a reflecting member in the recess so that the reflecting member covers the light emitting element and the light guiding member.

2. The method of manufacturing a light emitting device according to claim 1, wherein the reflecting member includes a first reflecting member and a second reflecting member and the step of disposing the reflecting member comprises:
   filling the second reflecting member in the recess; and
   covering the light emitting element, the light guiding member and the second reflecting member with the first reflecting member.

3. The method of manufacturing a light emitting device according to claim 2, wherein the second reflecting member contains a coloring substance.

4. The method of manufacturing a light emitting device according to claim 1, wherein lateral surfaces of the recess on the light guiding member side are formed substantially perpendicular to the light emitting surface of the light emitting element in sectional view.

5. The method of manufacturing a light emitting device according to claim 1, wherein the recess is tapered toward an upper surface of the light emitting device.

6. The method of manufacturing a light emitting device according to claim 1, wherein the light guiding member is positioned between the wavelength conversion member and the light emitting element.

7. The method of manufacturing a light emitting device according to claim 1, wherein a depth of the recess is 60% or less with respect to a thickness of the wavelength conversion member.

8. The method of manufacturing a light emitting device according to claim 1, wherein the wavelength conversion member is one obtained by stacking a plurality of wavelength conversion members containing different wavelength conversion substances.

9. The method of manufacturing a light emitting device according to claim 1, wherein the wavelength conversion member includes a light transmitting layer substantially free from a wavelength conversion substance.

* * * * *